United States Patent
Pang et al.

(10) Patent No.: US 9,607,707 B1
(45) Date of Patent: Mar. 28, 2017

(54) WEAK ERASE PRIOR TO READ

(71) Applicant: SanDisk Technologies LLC, Plano, TX (US)

(72) Inventors: Liang Pang, Fremont, CA (US); Yingda Dong, San Jose, CA (US); Xuehong Yu, San Jose, CA (US); Jingjian Ren, San Jose, CA (US)

(73) Assignee: SanDisk Technologies LLC, Plano, TX (US)

(*) Notice: Subject to any disclaimer, the term of this patent is extended or adjusted under 35 U.S.C. 154(b) by 0 days.

(21) Appl. No.: 15/198,228

(22) Filed: Jun. 30, 2016

(51) Int. Cl.
*G11C 11/34* (2006.01)
*G11C 16/26* (2006.01)
*G11C 16/04* (2006.01)
*G11C 16/16* (2006.01)
*G11C 16/34* (2006.01)
*G11C 16/32* (2006.01)

(52) U.S. Cl.
CPC .......... *G11C 16/26* (2013.01); *G11C 16/0466* (2013.01); *G11C 16/0483* (2013.01); *G11C 16/16* (2013.01); *G11C 16/32* (2013.01); *G11C 16/3445* (2013.01)

(58) Field of Classification Search
CPC ........ G11C 7/062–7/065; G11C 16/00–16/349
USPC .......................... 365/185.21, 185.22, 185.29
See application file for complete search history.

(56) References Cited

U.S. PATENT DOCUMENTS

| | | | |
|---|---|---|---|
| 5,889,698 A * | 3/1999 | Miwa | G11C 16/10 365/184 |
| 6,614,683 B1 | 9/2003 | Parker | |
| 6,819,592 B2 | 11/2004 | Noguchi et al. | |
| 7,440,318 B2 | 10/2008 | Fong et al. | |
| 7,715,235 B2 | 5/2010 | Cernea | |
| 8,130,551 B2 | 3/2012 | Oowada et al. | |
| 8,472,266 B2 | 6/2013 | Khandelwal et al. | |
| 8,670,285 B2 | 3/2014 | Dong et al. | |
| 8,830,755 B1 | 9/2014 | Dong et al. | |
| 8,982,637 B1 | 3/2015 | Dong et al. | |
| 9,171,632 B2 | 10/2015 | Dong et al. | |
| 9,286,994 B1 | 3/2016 | Chen et al. | |
| 9,336,892 B1 | 5/2016 | Chen et al. | |
| 9,349,478 B2 | 5/2016 | Yuan et al. | |
| 2003/0121584 A1* | 7/2003 | Aoki | G11C 29/006 156/60 |
| 2014/0247663 A1 | 9/2014 | Yuan et al. | |

* cited by examiner

*Primary Examiner* — Han Yang
(74) *Attorney, Agent, or Firm* — Vierra Magen Marcus LLP

(57) ABSTRACT

Techniques are disclosed for accurately sensing memory cells without having to wait for a voltage that creeps up on word line after a sensing operation to die down. The word line creep up could cause electrons to trap in shallow interface traps of a memory cell, hence impacting its threshold voltage. In one aspect, trapped electrons are removed (e.g., de-trapped) from shallow interface traps of a memory cell using a weak erase operation. Therefore, problems associated with word line voltage creep up are reduced or prevented. Thus, the memory cell can be sensed without waiting, while still providing an accurate result. The weak erase could be part of a sensing operation, but that is not required. For example, the weak erase could be incorporated into the beginning part of a read operation, which provides for a very efficient solution.

20 Claims, 20 Drawing Sheets

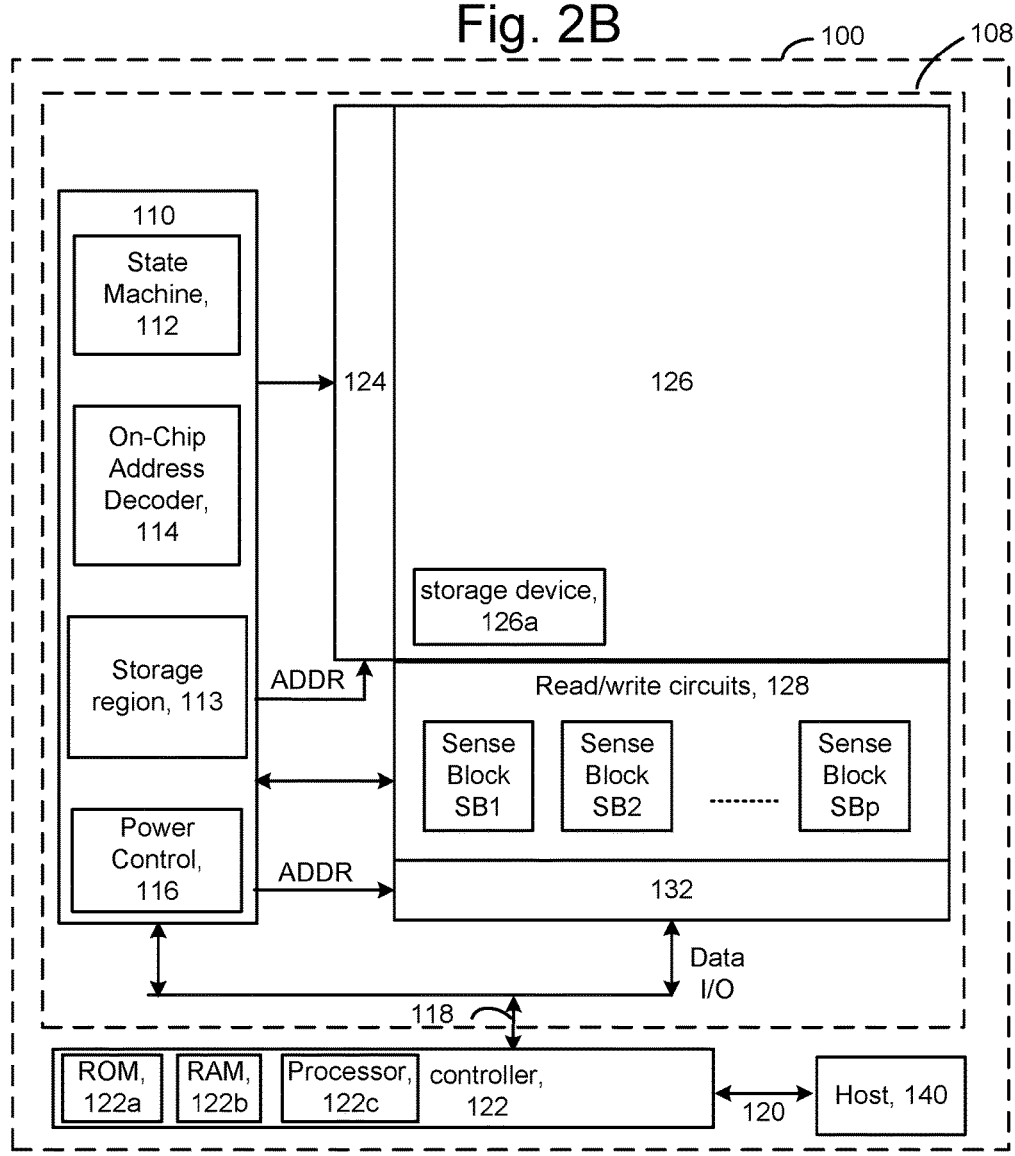

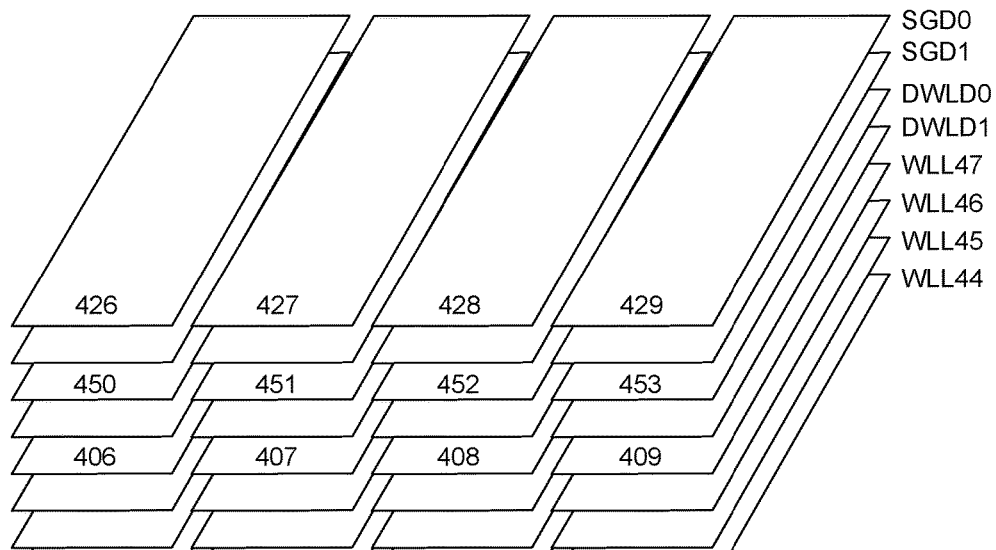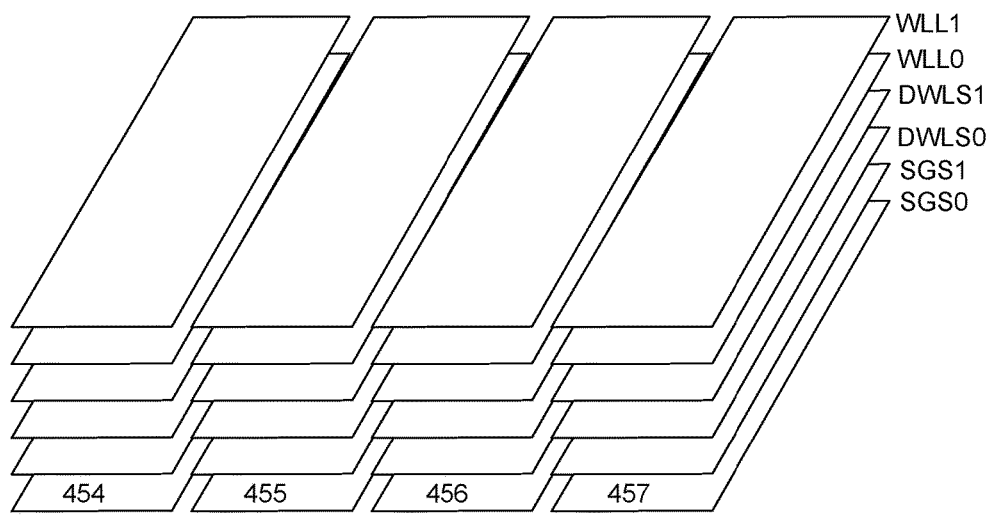
Fig. 4D

WEAK ERASE PRIOR TO READ

BACKGROUND

The present technology relates to a memory device and to techniques for operating a memory device.

Recently, ultra high density storage devices have been proposed using a three-dimensional (3D) stacked memory structure. One example of a 3D memory structure is the Bit Cost Scalable (BiCS) architecture which comprises a stack of alternating conductive and dielectric layers. A memory hole is formed in the stack and a NAND string is then formed by filling the memory hole with materials including a charge-trapping layer. A straight NAND string extends in one memory hole, while a pipe- or U-shaped NAND string (P-BiCS) includes a pair of vertical columns of memory cells which extend in two memory holes and which are joined by a bottom back gate. Control gates of the memory cells and of select gate transistors are provided by the conductive layers.

However, various challenges are presented in operating such memory devices.

BRIEF DESCRIPTION OF THE DRAWINGS

Like-numbered elements refer to common components in the different figures.

FIG. 2B is a functional block diagram of a memory device such as the 3D stacked non-volatile memory device 100 of FIG. 2A.

FIG. 4D depicts an alternative view of the select gate layers and word line layers of the stack 440 of FIG. 4C.

DETAILED DESCRIPTION

Techniques are provided for performing a sensing operation in a memory device. Embodiments reduce or eliminate problems that arise from word line (or control gate) creep up, in which word line voltages creep up after a sensing operation. The crept up voltage may attract electrons from a memory cell channel into shallow interface traps in the memory cell, thereby changing the memory cell's threshold voltage. If a sufficient amount of time passes prior to sensing the memory cell, the crept up word line voltage will eventually die down. Consequently, the electrons that were attracted into the shallow interface traps may leave the shallow interface traps. Thus, the memory cell's threshold voltage may eventually return to the correct level. Techniques are disclosed herein for accurately sensing memory cells without having to wait for a crept up word line voltage to die down.

Some embodiments are practiced in a 3D memory device. In some embodiments, the charge storage region of the memory cells comprises a charge-trapping material such as silicon nitride or other nitride, or in a multi-layer configuration such as an oxide-nitride-oxide (O—N—O) configuration. The charge-trapping material is separated from a channel layer by a tunneling layer. For example, a charge-trapping memory device may be a 3D memory device in which a stack of alternating conductive and dielectric layers are formed. Memory holes are etched in the stack and films are deposited in the holes such that memory cells or select gate transistors are formed where the conductive layers intersect with the memory holes. The films may include a charge-trapping layer which extends vertically along an individual cell or an entire NAND string, a tunneling layer and a channel layer. Some of the conductive layers are used as control gates (or word lines) for memory cells and other conductive layers are used as control gates for select gate transistors, such as drain or source-side transistors in NAND strings. In some embodiments, the charge-trapping material is used in memory cells in 2D NAND.

Figure 1A:
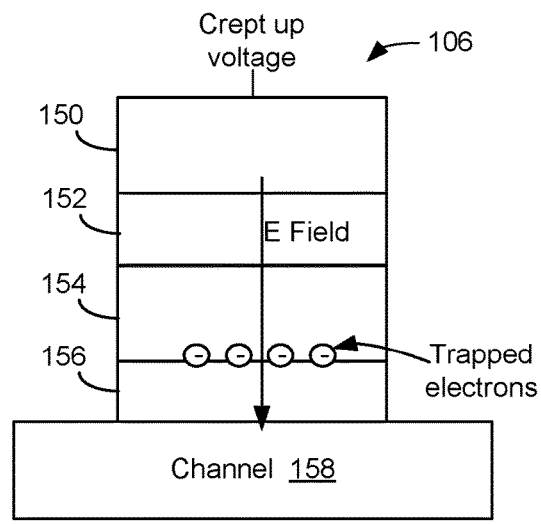
FIG. 1A shows a memory cell having charged trapped due to a crept up voltage.

A sensing operation may be used to determine a threshold voltage of an individual cell. FIG. 1A shows a memory cell 106 having a control gate 150, dielectric blocking layer 152, charge storage region 154, tunnel dielectric layer 156, and channel 158. The memory cell may be one of many memory cells on a string (e.g., NAND string). The string of memory cells may share the channel 158. The string of memory cells could be in a 3D memory array or a 2D memory array.

Figure 1B:
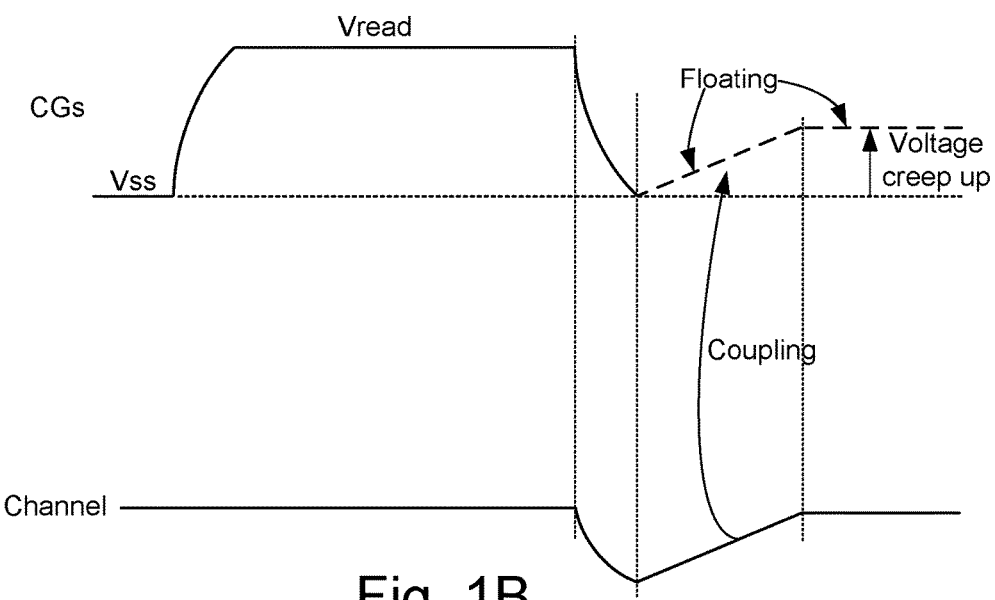
FIG. 1B shows a timing diagram of voltages applied to control gates (CG) during a sensing operation, as well as the channel voltage.

FIG. 1B shows a timing diagram of voltages applied to memory cell control gates (CG) during a sensing operation, as well as the channel voltage. The sensing operation could be, for example, a read or a program verify. The sensing operation typically includes applying a read pass voltage (e.g., Vread) to control gates of unselected memory cells on a string while applying a reference voltage (e.g., Vcgr) to the control gate of the memory cell that has been selected for sensing (e.g., "selected memory cell"). The reference voltage might be a read reference voltages for a read operation, a verify voltage for a program verify operation, etc. In some embodiments, after the selected memory cell has been sensed, its control gate voltage is raised to a read pass voltage. Thus, all of the control gate of all of the memory cells on the string may be at the read pass voltage. A read pass voltage is a voltage that is sufficient to place the memory cell into a conductive state, assuming that its threshold voltage is within a range of threshold voltages assigned to different data states. It is not required that the read pass voltage have the same magnitude for all memory cells on the string, but that is one possibility.

During the sensing operation, various memory cells on the string may be in a conductive state. Hence, there may be electrons in the channel. As depicted in FIG. 1B, after sensing the selected memory cell, the control gate voltages may be discharged from the read pass voltage down to a steady state voltage (e.g., Vss). During this discharge, it is possible for some of the electrons to remain in some portions of the channel. As depicted in FIG. 1B, after the control gates have been discharged to the steady state voltage, the word lines (or control gates) may be floated. It is possible for capacitive coupling between the channel and the control gates to cause the voltage on the control gates to creep up after the sensing operation. The voltage difference between the control gate 150 and channel 158 results in an electric field (E field), as depicted in FIG. 1A. As depicted in FIG. 1A, the E field could attract residual electrons from the channel 158 into shallow interface traps in the memory cell 106. The shallow interface traps may be in the charge trapping layer 154. These trapped electrons could raise the threshold voltage of the memory cell 106.

If the memory cell 106 were to be sensed again with the electrons still trapped in the shallow interface traps, the threshold voltage may be changed from its intended (e.g., correct) value. After a sufficient amount of time, the control gate voltage may drop back down to the steady state voltage (e.g., Vss). The residual electrons that were trapped in the shallow interface traps may then become de-trapped. Therefore, the threshold voltage of the memory cell 106 may return to the correct level. However, it may take considerable time (e.g., 20 minutes) for the voltage to settle down and the electrons to de-trap.

Note that any of the memory cells on the string having a memory cell that was sensed could potentially have its threshold voltage impacted by the word line voltage creep up problem. Thus, word line voltage creep up can impact sensing the same memory cell again, or sensing a different memory cell on the string.

Embodiments disclosed herein remove residual electrons after a sensing operation of a memory cell on a memory cell string (such as a NAND string). Hence, a memory cell on the string can be sensed without having to wait for effects of word line voltage creep up to subside.

In one embodiment, residual electrons are purged from the string channel after a sensing operation. Residual electrons might be purged from the entire string channel, or a portion thereof. Thus, trapping of electrons in shallow interface traps of memory cells on the string is reduced or prevented. Therefore, problems associated with control gate voltage creep up are reduced or prevented. Thus, a memory cell on the string can be sensed without waiting a substantial time after a sensing operation of some memory cell on the string, while still providing an accurate result.

In one embodiment, the read pass voltage is discharged in a way that purges residual electrons from the entire memory string channel after a sensing operation. Because residual electrons have been purged from the entire memory string the channel, no or very few electrons will be trapped in the shallow interface traps of any of the memory cells on the string if the word line voltage does creep up. Thus, the word line voltage may still creep up after the sensing operation without impacting the threshold voltage of the memory cells on the string.

In one embodiment, the read pass voltage is discharged in a way that purges residual electrons from a portion of the memory string channel after a sensing operation. Because residual electrons have been purged from a portion of the memory string the channel, no or very few electrons will be trapped in the shallow interface traps of memory cells adjacent to the portion of the channel from which residual electrons have been purged if the word line voltage does creep up. Thus, the word line voltage may still creep up after the sensing operation without impacting the threshold voltage of the memory cells adjacent to the portion of the memory string channel from which residual electrons have been purged.

In one embodiment, residual electrons are purged from the memory string channel by discharging the read pass voltage in a manner that provides a path for residual electrons to leave the channel. The electrons may leave to, for example, a bit line or a source line. In one embodiment, a control circuit begins to discharge the read pass voltage from the memory cell control gates at different strategic times in order to provide the path for residual electrons to leave the memory cell channel.

In one embodiment, residual electrons are purged from a portion of the memory string channel by discharging the read pass voltage in a manner that provides a path for residual electrons to leave the portion of the channel. In one embodiment, a control circuit begins to discharge the read pass voltage from the memory cell control gates at different strategic times in order to provide the path for residual electrons to leave the portion of the memory cell string channel.

In one embodiment, trapped electrons are removed (e.g., de-trapped) from the shallow interface traps of at least one of the memory cells on the string using a weak erase operation. The trapped electrons referred to here may be the result of the word line voltage creep up problem from sensing one of the memory cells on the string. Therefore, problems associated with word line voltage creep up are reduced or prevented. Thus, the memory cell that was weakly erased can be sensed without waiting, while still providing an accurate result. The weak erase could be part of a sensing operation, although that is not required. For example, the weak erase could be incorporated into the beginning part of a sensing operation, which provides for a very efficient solution.

The following discussion provides details of the construction of example memory devices and of related techniques which address the above and other issues.

Figure 2A:
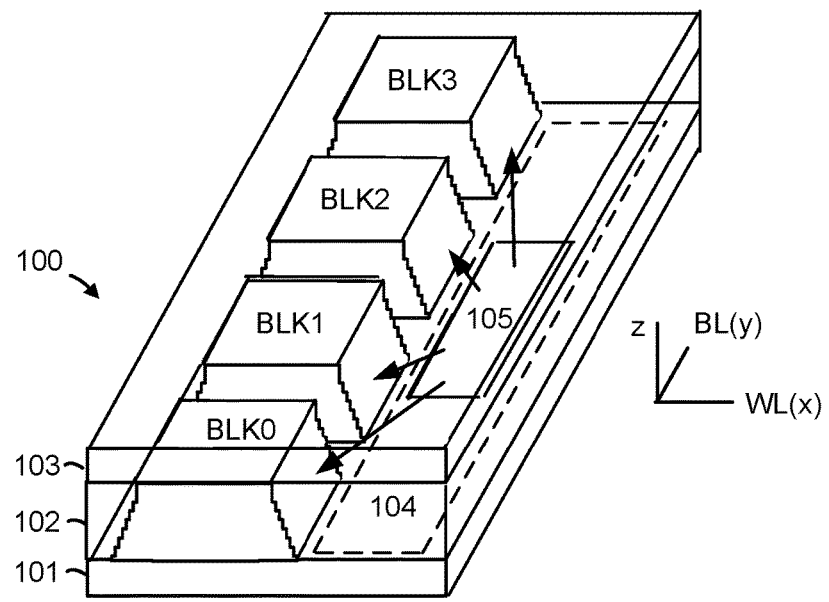
FIG. 2A is a perspective view of a set of blocks in a 3D stacked non-volatile memory device.

FIG. 2A is a perspective view of a set of blocks in a 3D stacked non-volatile memory device. The memory device 100 includes a substrate 101. On the substrate are example blocks BLK0, BLK1, BLK2 and BLK3 of memory cells (storage elements) and a peripheral area 104 with circuitry for use by the blocks. For example, the circuitry can include voltage drivers 105 which can be connected to control gate layers of the blocks. In one approach, control gate layers at a common height in the blocks are commonly driven. The substrate 101 can also carry circuitry under the blocks, along with one or more lower metal layers which are patterned in conductive paths to carry signals of the circuitry. The blocks are formed in an intermediate region 102 of the memory device. In an upper region 103 of the memory device, one or more upper metal layers are patterned in conductive paths to carry signals of the circuitry. Each block comprises a stacked area of memory cells, where alternating levels of the stack represent control gate layers. In one possible approach, the control gate layers of each block at a common height are connected to one another and to a voltage driver. While four blocks are depicted as an example, two or more blocks can be used, extending in the x- and/or y-directions.

Figure 4A:
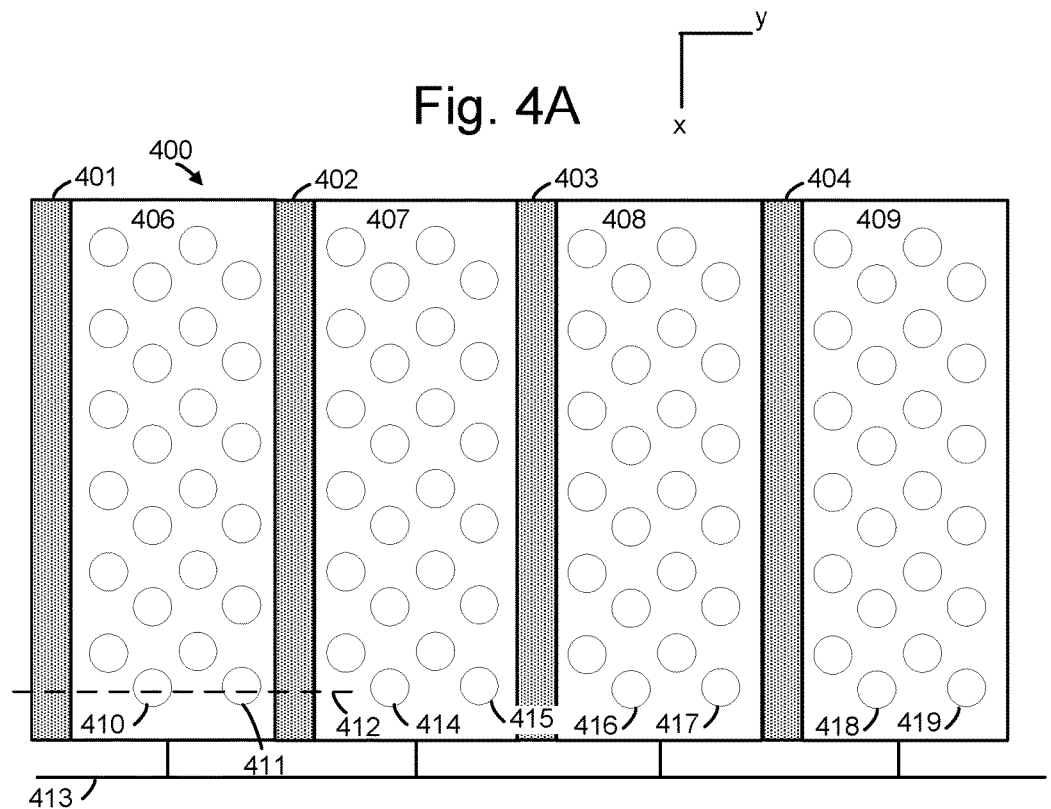
FIG. 4A depicts a top view of an example word line layer 400 of the block BLK0 of FIG. 2A, in a straight NAND string embodiment.
Figure 4B:
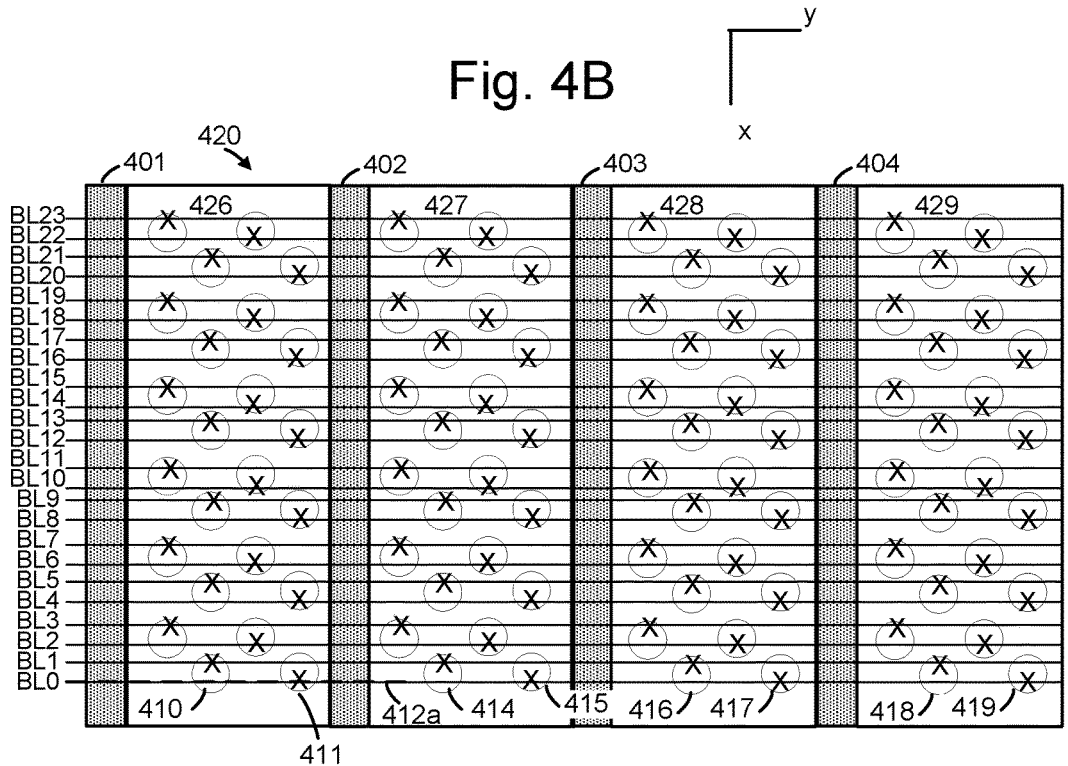
FIG. 4B depicts a top view of an example SGD layer 420, consistent with FIG. 4A.

Each control gate layer in a block can be divided into regions such as depicted in FIGS. 4A, 4B and 4D, in one possible approach.

The length of the plane, in the x-direction, may represent a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

FIG. 2B is a functional block diagram of a memory device such as the 3D stacked non-volatile memory device 100 of FIG. 2A. The memory device 100 may include one or more memory die 108. The set of blocks of FIG. 2A can be on one die. The memory die 108 includes a memory structure 126 of memory cells, such as an array of memory cells, control circuitry 110, and read/write circuits 128. In a 3D configuration, the memory structure can include the blocks of FIG. 2A. The memory structure 126 is addressable by word lines via a row decoder 124 and by bit lines via a column decoder 132. The read/write circuits 128 include multiple sense blocks SB1, SB2, . . . , SBp (sensing circuitry) and allow a page of memory cells to be read or programmed in parallel. Typically a controller 122 is included in the same memory device 100 (e.g., a removable storage card) as the one or more memory die 108. Commands and data are transferred between the host 140 and controller 122 via a data bus 120 and between the controller and the one or more memory die 108 via lines 118.

The memory structure can be 2D or 3D. The memory structure may comprise one or more array of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations. A storage region 113 may be provided for parameters for operating the memory device such as programming parameters for different rows or other groups of memory cells. These programming parameters could include bit line voltages and verify voltages.

The on-chip address decoder 114 provides an address interface between that used by the host or a memory controller to the hardware address used by the decoders 124 and 132. The power control module 116 controls the power and voltages supplied to the word lines and bit lines during memory operations. It can includes drivers for word line layers (WLLs) in a 3D configuration, SGS and SGD select gates and source lines. The sense blocks can include bit line drivers, in one approach. An SGS select is a gate transistor at a source-end of a NAND string, and an SGD select gate is a transistor at a drain-end of a NAND string.

In some implementations, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks SB1, SB2, . . . , SBp, read/write circuits 128, controller 122, and so forth.

The off-chip controller 122 may comprise a processor 122c and storage devices (memory) such as ROM 122a and RAM 122b. The storage devices comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

The code is used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and select gate transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements. The columns may be arranged in a two dimensional configuration, e.g., in an x-y plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the two dimensional and three dimensional exemplary structures described but covers all relevant memory structures within the spirit and scope of the technology as described herein and as understood by one of skill in the art.

Figure 3:
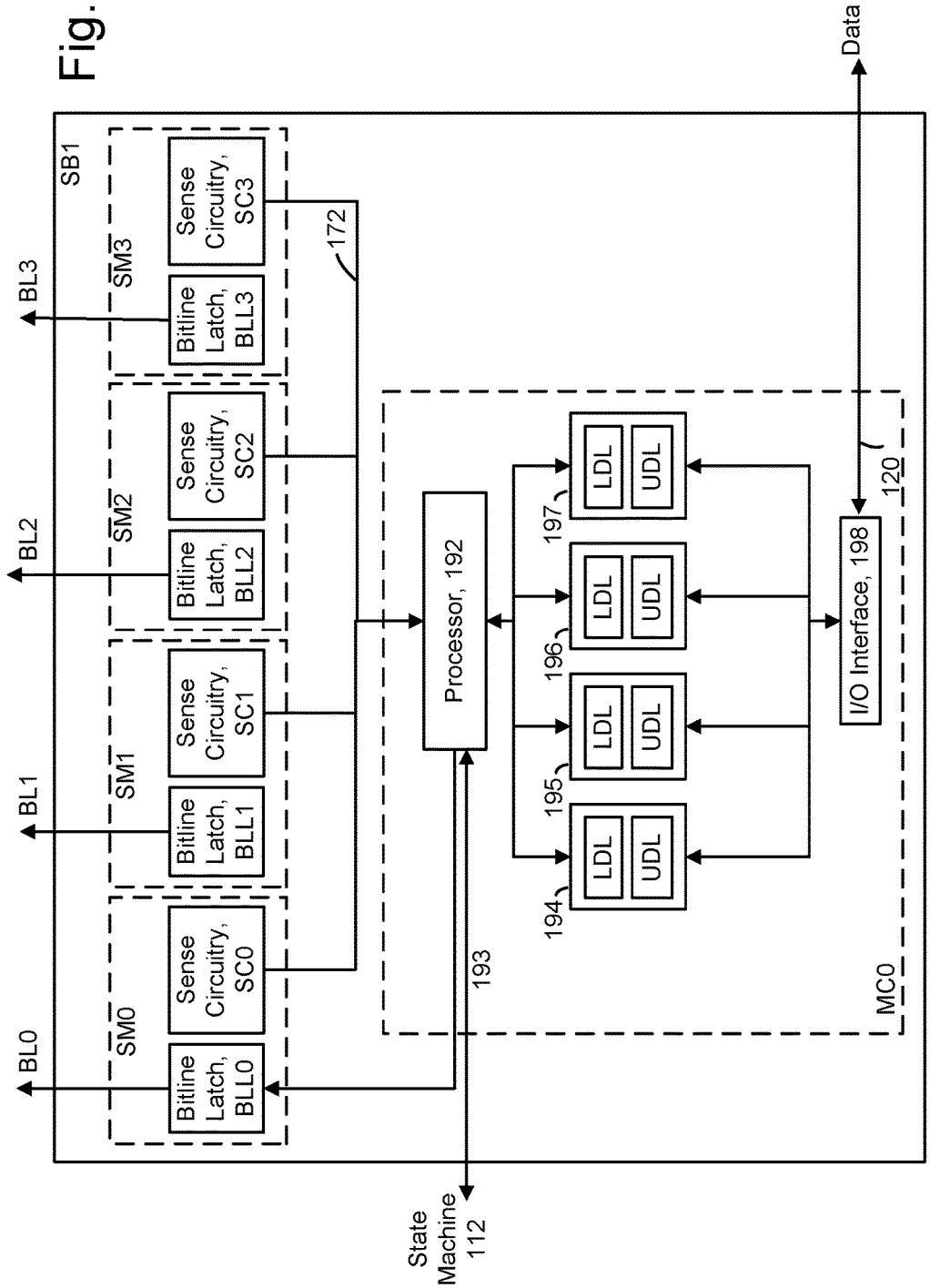
FIG. 3 is a block diagram depicting one embodiment of the sense block SB1 of FIG. 2B.

FIG. 3 is a block diagram depicting one embodiment of the sense block SB1 of FIG. 2B. The sense block is partitioned into one or more core portions, referred to as sense modules (e.g., SM0) or sense amplifiers, and a common portion, referred to as a managing circuit (e.g., MC0). In one embodiment, there is a separate sense module for each bit line and one common managing circuit for a set of sense modules, such as SM0, SM1, SM2 and SM3. Each of the sense modules in a group communicates with the associated managing circuit via a data bus 172. Thus, there are one or more managing circuits which communicate with the sense modules of a set of memory cells.

Each sense module SM0, SM1, SM2 and SM3 comprises sense circuitry SC0, SC1, SC2 and SC3, respectively, that performs sensing by determining whether a conduction current in a connected bit line BL0, BL1, BL2 and BL3, respectively, is above or below a predetermined threshold voltage (verify voltage). Each sense module SM0, SM1, SM2 and SM3 also includes a bit line latch BLL0, BLL1, BLL2 and BLL3, respectively, that is used to set a voltage condition on the connected bit line. For example, during a programming voltage, a predetermined state latched in a bit line latch will result in the connected bit line being pulled to a lockout state (e.g., 1.5-3 V), a slow programming state (e.g., 0.5-1 V) or a normal programming state (e.g., 0 V).

Managing circuit MC0 comprises a processor 192, four example sets of data latches 194, 195, 196 and 197 and an I/O interface 198 coupled between the sets of data latches and the data bus 120. One set of data latches can be provide for each sense module, and may include data latches identified by LDL and UDL. LDL stores a bit for a lower page (LP) of write data, and UDL stores a bit for an upper page (UP) of write data, in a memory which stores two bits of data in each memory cell.

Additional data latches could be used as well. For example, in a three-bit per memory cell implementation, one extra data latch may be used to store a middle page (MP) of data. A four-bit per memory cell implementation can use lower-middle and upper-middle data latches. The techniques provided herein are meant to encompass such variations. In a further option, another latch is used to identify whether a memory cell is in a slow programming mode when its Vth is within a specified margin of the verify voltage of its target data state.

The processor 192 performs computations during reading and programming. For reading, the processor determines the data state stored in the sensed memory cell and stores the data in the set of data latches. For full programming and refresh programming, the processor reads the latches to determine the data state which is to be written to a memory cell.

During reading, the operation of the system is under the control of the state machine 112 which controls the supply of different control gate voltages to the addressed memory cell. As it steps through the various predefined control gate voltages (e.g., VrEr/A, VrA/B and VrB/C in FIG. 6; or VrA, VrB, Vrc, VrD, VrE, VrF, and VrD in FIG. 8) corresponding to the various memory states supported by the memory (e.g., states A, B and C; or A, B, C, D, E, F, and G), the sense module may trip at one of these voltages and a corresponding output will be provided from the sense module to the processor 192 via the data bus 172. At that point, processor 192 determines the memory state by consideration of the tripping event(s) of the sense module and the information about the applied control gate voltage from the state machine via input lines 193. It then computes a binary encoding for the memory state and stores the resultant data bits into the sets of data latches 194-197. In another embodiment of the managing circuit MC0, the bit line latch serves both as a latch for latching the output of the sense module and also as a bit line latch as described above.

Some implementations can include multiple processors. In one embodiment, each processor will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with four sense modules, the state machine needs to read the wired-OR line four times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations, the data to be programmed (write data) is stored in the set of data latches 194-197 from the data bus 120, in the LP and UP data latches. The programming operation, under the control of the state machine, comprises a series of programming voltage pulses applied to the control gates of the addressed memory cells. Each programming voltage is followed by a read back (verify test) to determine if the memory cell has been programmed to the desired memory state. In some cases, processor monitors the read back memory state relative to the desired memory state. When the two states agree, the processor sets the bit line latch to cause the bit line to be pulled to a state designating program inhibit (e.g., 2-3 V). This inhibits the memory cell coupled to the bit line from further programming even if programming voltages appear on its control gate. In other embodiments, the processor initially loads the bit line latch and the sense circuitry sets it to an inhibit value during the verify process.

Each set of data latches 194-197 may be implemented as a stack of data latches for each sense module. In one embodiment, there are three data latches per sense module. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

FIG. 4A depicts a top view of an example word line layer 400 of the block BLK0 of FIG. 2A, in a straight NAND string embodiment. As mentioned, a word line layer in each block in FIG. 2A can be divided into regions. Each region can extend between slits which are formed periodically in the stack to process the word line layers during the fabrication process of the memory device. This processing can include replacing a sacrificial material of the word line layers with metal. Generally, the distance between slits should be relatively small to account for a limit in the distance that an etchant can travel laterally to remove the sacrificial material, and that the metal can travel to fill a void which is created by the removal of the sacrificial material. For example, the distance between slits may allow for a few rows of memory holes between adjacent slits. The layout of the memory holes and slits should also account for a limit in the number of bit lines which can extend across the region while each bit line is connected to a different memory cell. After processing the word line layers, the slits can optionally be filed with metal to provide an interconnect through the stack.

This figures and other are not necessarily to scale. In practice, the regions can be much longer in the x-direction relative to the y-direction than is depicted to accommodate additional memory holes.

In this example, there are four rows of memory holes between adjacent slits. A row here is a group of memory holes which are aligned in the x-direction. Moreover, the rows of memory holes are in a staggered pattern to increase the density of the memory holes. The word line layer is divided into regions 406, 407, 408 and 409 which are each connected by a connector 413. The last region of a word line layer in a block can be connected to a first region of a word line layer in a next block, in one approach. The connector, in turn, is connected to a voltage driver for the word line layer. The region 406 has example memory holes 410 and 411 along a line 412. See also FIG. 4C. The region 407 has example memory holes 414 and 415. The region 408 has example memory holes 416 and 417. The region 409 has example memory holes 418 and 419.

Each circle represents the cross-section of a memory hole at a word line layer or select gate layer. Each circle can alternatively represent a memory cell which is provided by the materials in the memory hole and by the adjacent word line layer.

Metal-filled slits 401, 402, 403 and 404 (e.g., metal interconnects) may be located between and adjacent to the edges of the regions 406-409. The metal-filled slits provide a conductive path from the bottom of the stack to the top of the stack. For example, a source line at the bottom of the stack may be connected to a conductive line above the stack, where the conductive line is connected to a voltage driver in a peripheral region of the memory device.

FIG. 4B depicts a top view of an example SGD layer 420, consistent with FIG. 4A. The SGD layer is divided into regions 426, 427, 428 and 429. Each region can be connected to a respective voltage driver. This allows a set of memory cells in one region of a word line layer to be programmed concurrently, with each memory cell being in a respective NAND string which is connected to a respective bit line. A voltage can be set on each bit line to allow or inhibit programming during each program voltage.

The region 426 has the example memory holes 410 and 411 along a line 412a which is coincident with a bit line BL0. See also FIG. 4C. The region 427 also has the example memory hole 414 which is coincident with a bit line BL1. A number of bit lines extend above the memory holes and are connected to the memory holes as indicated by the "X" symbols. BL0 is connected to a set of memory holes which includes the memory holes 411, 415, 417 and 419. Another example bit line BL1 is connected to a set of memory holes which includes the memory holes 410, 414, 416 and 418. The metal-filled slits 401, 402, 403 and 404 from FIG. 4A are also depicted, as they extend vertically through the stack. The bit lines can be numbered in a sequence BL0-BL23 across the SGD layer 420 in the −x direction.

Different subsets of bit lines are connected to cells in different rows. For example, BL0, BL4, BL8, BL12, BL16 and BL20 are connected to cells in a first row of cells at the right hand edge of each region. BL2, BL6, BL10, BL14, BL18 and BL22 are connected to cells in an adjacent row of cells, adjacent to the first row at the right hand edge. BL3, BL7, BL11, BL15, BL19 and BL23 are connected to cells in a first row of cells at the left hand edge of each region. BL1, BL5, BL9, BL13, BL17 and BL21 are connected to cells in an adjacent row of cells, adjacent to the first row at the left hand edge.

Figure 4C:
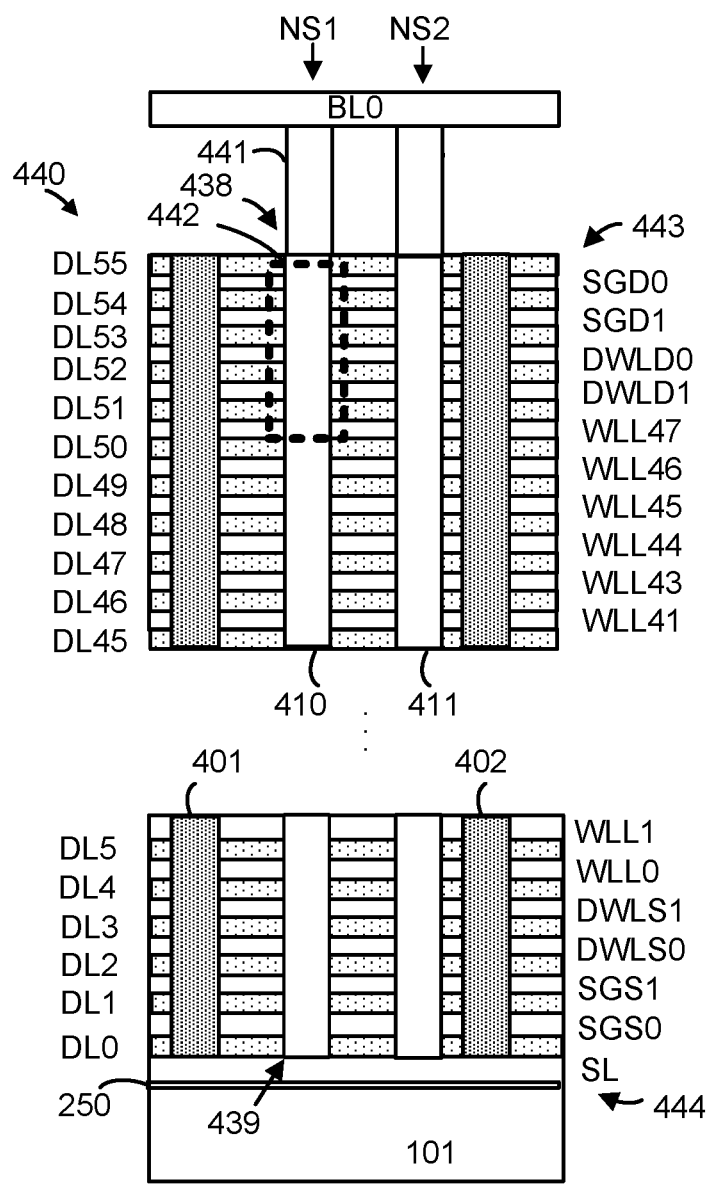
FIG. 4C depicts an embodiment of a stack 440 showing a cross-sectional view along line 412 of FIG. 4A and line 412a of FIG. 4B.

FIG. 4C depicts an embodiment of a stack 440 showing a cross-sectional view along line 412 of FIG. 4A and line 412a of FIG. 4B. The stack 440 has alternating conductive and insulating layers. The insulating layers are labeled DL0-DL55, and may be a dielectric material such as silicon oxide. The conductive layers include: two SGD layers, two SGS layers, four dummy word line layers DWLD0, DWLD1, DWLS0 and DWLS1, in addition to the data word line layers WLL0-WLL47. The conductive layers could be formed from, for example, tungsten. Columns of memory cells corresponding to NAND strings NS1 and NS2 are depicted in the multi-layer stack. The stack includes a substrate 101, an insulating film 250 on the substrate, and a portion of a source line SL. NS1 has a source-end 439 at a bottom 444 of the stack and a drain-end 438 at a top 443 of the stack. The metal-filled slits 401 and 402 from FIGS. 4A and 4B are also depicted. A portion of the bit line BL0 is also depicted. A conductive via 441 connects the drain-end 438 to BL0. A region 442 of the stack is shown in greater detail in FIG. 5.

FIG. 4D depicts an alternative view of the select gate layers and word line layers of the stack 440 of FIG. 4C. The SGD layers SGD0 and SGD0 each includes parallel rows of select gate lines associated with the drain-side of a set of NAND strings. For example, SGD0 includes drain-side select gate regions 426, 427, 428 and 429, consistent with FIG. 4B.

Below the SGD layers are the drain-side dummy word line layers. Each dummy word line layer represents a word line, in one approach, and is connected to a set of dummy memory cells at a given height in the stack. For example, DWLD0 comprises word line layer regions 450, 451, 452 and 453. A dummy memory cell, also referred to as a non-data memory cell, does not store data and is ineligible to store data, while a data memory cell is eligible to store data. Moreover, the Vth of a dummy memory cell is generally fixed at the time of manufacturer or may be periodically adjusted, while the Vth of the data memory cells changes more frequently, e.g., during erase and programming operations of the data memory cells.

Below the dummy word line layers are the data word line layers. For example, WLL10 comprises word line layer regions 406, 407, 408 and 409, consistent with FIG. 4A.

Below the data word line layers are the source-side dummy word line layers.

Below the source-side dummy word line layers are the SGS layers. The SGS layers SGS0 and SGS1 each includes parallel rows of select gate lines associated with the source-side of a set of NAND strings. For example, SGS0 includes source-side select gate lines 454, 455, 456 and 457. Each select gate line can be independently controlled, in one approach. Or, the select gate lines can be connected and commonly controlled.

Figure 5:
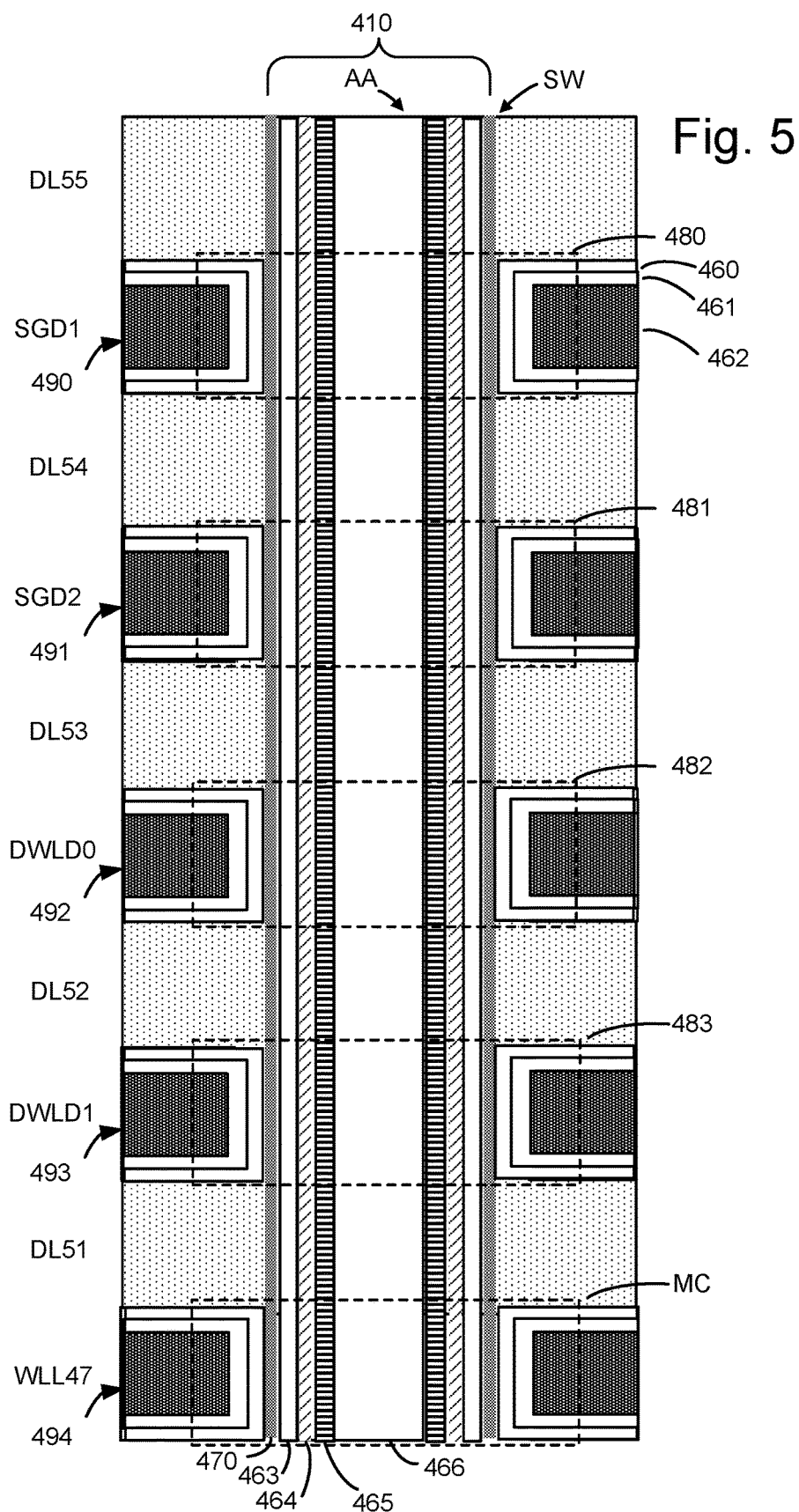
FIG. 5 depicts a view of the region 442 of FIG. 4C.

FIG. 5 depicts a view of the region 442 of FIG. 4C. SGD select gates 480 and 481 are provided above dummy memory cells 482 and 483 and a data memory cell MC. A number of layers can be deposited along the sidewall (SW) of the memory hole 410 and/or within each word line layer, e.g., using atomic layer deposition. For example, each column (e.g., the pillar which is formed by the materials within a memory hole) can include a charge-trapping layer or film 463 such as SiN or other nitride, a tunneling layer 464, a polysilicon body or channel 465, and a dielectric core 466. A word line layer can include a blocking oxide 470, a block high-k material 460, a metal barrier 461, and a conductive metal 462 such as Tungsten as a control gate. For example, control gates 490, 491, 492, 493 and 494 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

The memory cells in FIG. 5 are one embodiment of memory cell 106 from FIG. 1A. Thus, control gates 490, 491, 492, 493 and 494 are one embodiment of control gate 150; together blocking oxide 470 and block high-k material 460 are one embodiment of dielectric blocking layer 152; charge-trapping layer or film 463 is one embodiment of charge storage region 154; tunneling layer 464 is one embodiment of tunnel dielectric layer 156; and polysilicon body or channel 465 is one embodiment of channel 158.

When a memory cell of FIG. 5 is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the WLLs in each of the memory holes.

In some cases, the tunneling layer 464 can comprise multiple layers such as in an oxide-nitride-oxide configuration.

The NAND string can be considered to have a floating body channel because the length of the channel is not formed on a substrate. Further, the NAND string is provided by a plurality of word line layers above one another in a stack, and separated from one another by dielectric layers (e.g., DL0-DL55).

Figure 6:
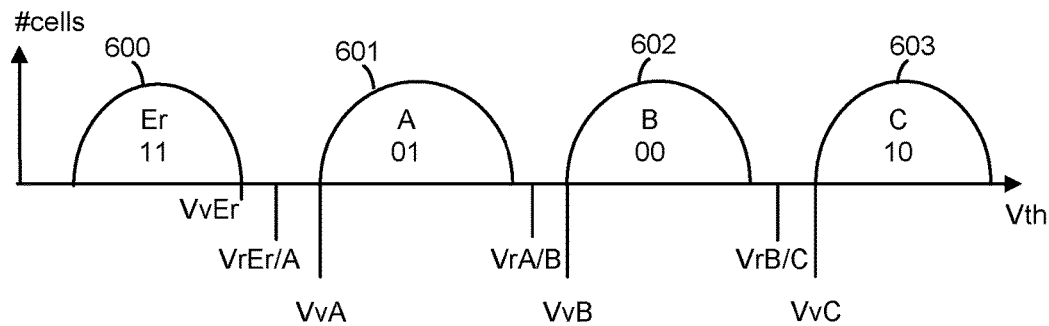
FIG. 6 depicts a threshold voltage (Vth) distribution and example read and verify voltages for a set of memory cells.

FIG. 6 depicts a threshold voltage (Vth) distribution and example read and verify voltages for a set of memory cells. The horizontal axis represents Vth and the vertical axis represents a number of memory cells on a logarithmic scale. The Vth distributions are shown in a simplified form for clarity.

In one approach, a one programming pass operation, also referred to as full sequence programming, involves (only) one sequence of multiple program-verify operations (or program loops) which are performed starting from an initial Vpgm level and proceeding to a final Vpgm level until the threshold voltages of a set of selected memory cells reach one or more respective verify voltages of respective target data states. All memory cells may initially be in an erased state at the beginning of the programming pass.

Example Vth distributions for the memory cell array are provided for a case where each memory cell stores two bits of data in one of four possible Vth ranges. One bit represents the LP data and the other bit represents the UP data. A bit combination can be denoted by the UP bit followed by the LP bit, e.g., 11 denotes UP=1 and LP=1, 01 denotes UP=0 and LP=1, 00 denotes UP=0 and LP=0 and 10 denotes UP=1 and LP=0. A bit combination is stored in a set of latches such as discussed previously. For example, the LP bit can be stored in LDL and the UP bit can be stored in UDL. In another example, each memory cell stores three bits of data in one of eight possible Vth ranges.

Vth distributions 601, 602 and 603 represent target data states A, B and C, respectively, which are reached by memory cells when their Vth exceeds the verify voltage VvA, VvB or VvC, respectively. A verify operation or test is performed to determine whether the Vth of a memory cell exceeds a verify voltage. VvEr is an erase verify voltage.

After the programming pass is completed, the data can be read from the memory cells using read reference voltages VrEr/A, VrA/B and VrB/C which are between the Vth distributions. By testing whether the Vth of a given memory cell is above or below one or more of the read reference voltages, the system can determine the data state which is represented by a memory cell.

Figure 7A:
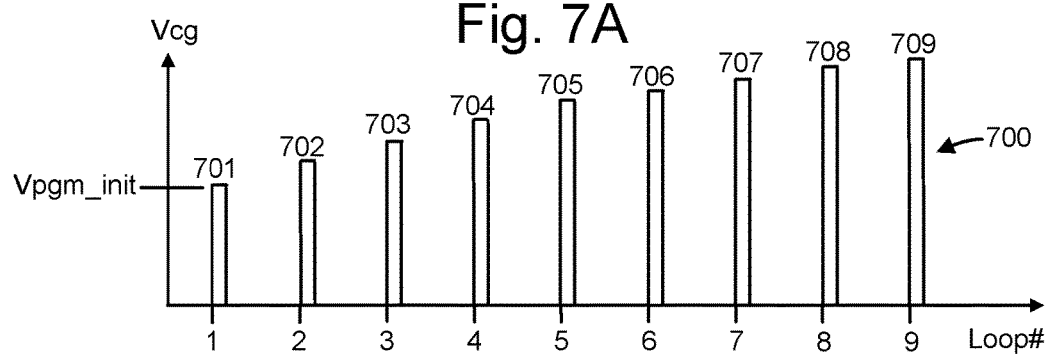
FIG. 7A depicts a set of program voltages in a programming operation.
Figure 7B:
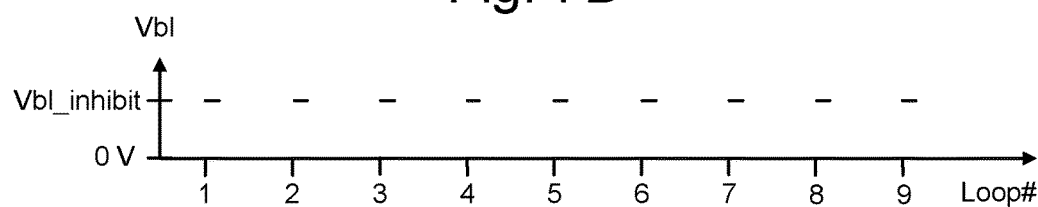
FIG. 7B depicts a set of bit line voltages in a programming operation, consistent with FIG. 7A.
Figure 7C:
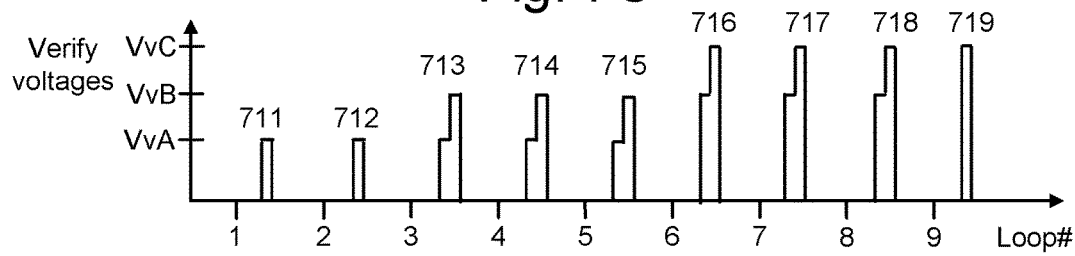
FIG. 7C depicts a set of verify voltages in a programming operation, consistent with FIG. 7A.

FIG. 7A depicts a set of program voltages in a programming operation. The vertical axis depicts Vcg, a control gate or word line voltage, and the horizontal axis depicts time or program loop number (e.g., program-verify iteration number). A one pass programming operation with four data states is depicted in FIG. 7A-7C. Other options are possible. The programming operation comprises a series of waveforms 700 comprising program voltages 701-709. Incremental step pulse programming is performed, such that Vpgm begins at an initial level, Vpgm_init and increases step-wise in each program loop. This example also performs verify tests based on the program loop (see FIG. 7C). For example, the A state cells are verified in loops 1 and 2, the A and B state cells are verified in loops 3-5, the B and C state cells are verified in loops 6-8 and the C state cells are verified in loop 9. The horizontal axes of FIG. 7A-7C are time-aligned.

FIG. 7B depicts a set of bit line voltages in a programming operation, consistent with FIG. 7A. Vbl_inhibit may be applied to the bit lines for the memory cells with a lockout or inhibit status (e.g., the erased state cells or the memory cells which have completed programming to a target data state). Vbl=0 V may be applied to the memory cells with a program status.

FIG. 7C depicts a set of verify voltages in a programming operation, consistent with FIG. 7A. Waveforms 711 and 712 in program loops 1 and 2, respectively, have a magnitude of VvA. Waveforms 713, 714 and 715 in program loops 3, 4 and 5, respectively, have a magnitude of VvA and VvB. Waveforms 716, 717 and 718 in program loops 6, 7 and 8, respectively, have a magnitude of VvB and VvC. Waveform 719 in program loop 9 has a magnitude of VvC. Specifically, in program loops 1 and 2, sensing occurs for the A state cells at VvA. In program loops 3, 4 and 5, sensing occurs for the A state cells at VvA and for the B state cells at VvB. In program loops 6, 7 and 8, sensing occurs for the B state cells at VvB and for the C state cells at VvC. In program loop 9, sensing occurs for the C state cells at VvC. This approach minimizes the number of verify operations by considering that memory cells with lower target data states will pass a verify test earlier in the programming operation than memory cells with higher target data states.

Figure 8A:
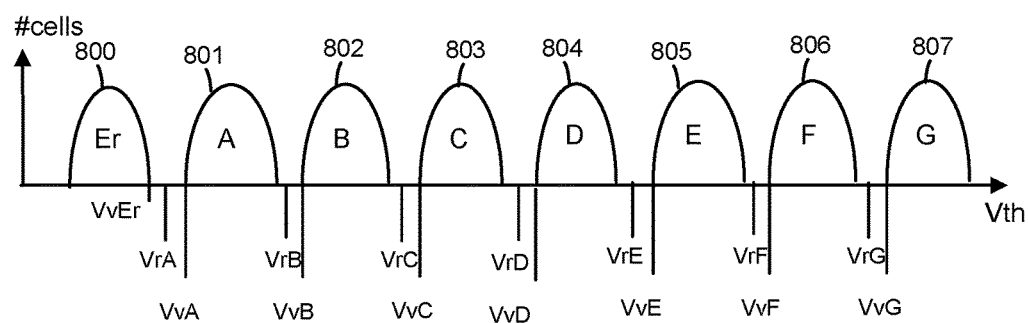
FIG. 8A depicts threshold voltage distributions when three bits are stored per memory cell.

The memory cells may be programmed to more or fewer than four states. In the example of FIG. 6, each memory cell could store two bits. Memory cells could store more or fewer than two bits each. FIG. 8A depicts threshold voltage distributions when three bits are stored per memory cell. In this case, there are eight threshold voltage distributions 800-807, representing an erase state (Er), and states A through G. Verify voltages Vva, VvB, VvC, VvD, VvE, VvF, and VvG are depicted. Read reference voltages Vra, VrB, VrC, VrD, VrE, VrF, and VrG are depicted. Programming and reading may be similar to that described in the example of storing and sensing two bits per memory cell.

Figure 8B:
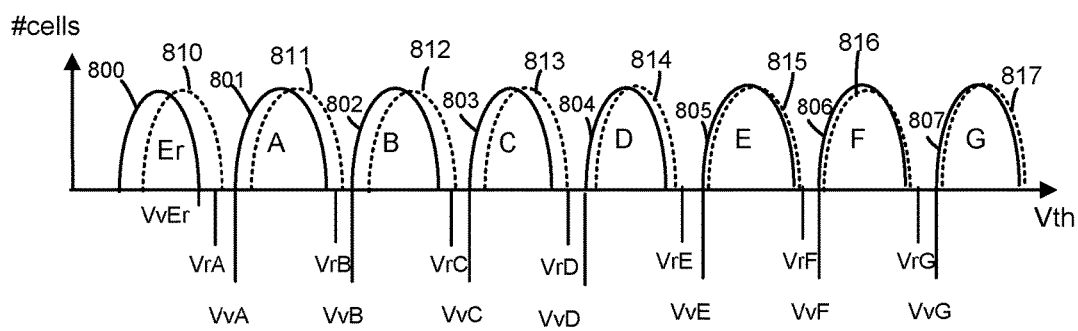
FIG. 8B depicts shifts to the threshold voltage distributions from FIG. 8A to illustrate a word line voltage creep up problem.

FIG. 8B depict the threshold voltage distributions 800-807 from FIG. 8A, with threshold voltage distributions 810-817 added to show a possible shift in the threshold voltage distributions 800-807 as a result of a word line voltage creep up problem. Prior to sensing the memory cells (e.g., prior to a read or program verify) the memory cells had the threshold voltage distributions 800-807 shown by the solid lines. After sensing the memory cells, the threshold voltage distributions may shift to the dotted line threshold voltage distributions 810-817. In this example, there is an upward shift to at least some of the individual threshold voltage distributions. Some distributions could be impacted more than others. For example, the lower (in voltage) states could suffer a larger shift than higher states, as one possibility. If enough time passes, the crept up word line voltage should return back to, for example, a steady state voltage. Thus, electrons trapped in shallow interface traps may be de-trapped. Hence, the threshold voltage distributions may return to the threshold voltage distributions 800-807.

Embodiments disclosed herein provide techniques for accurately sensing again immediately (or at least very soon) after a sensing operation that could potentially cause a shift in the threshold voltage distributions. In one embodiment, techniques are provided for preventing the shift from occurring. Thus, the shifted threshold voltage distributions 810-817 do not occur after sensing. In one embodiment, preventing the shift of the threshold voltage distribution from occurring is accomplished by strategic discharge of read pass voltages on word lines. In one embodiment, the order in which the read pass voltages are discharged purges residual electrons from a NAND channel. In one embodiment, the order in which the read pass voltages are discharged purges residual electrons from at least a portion of a NAND channel. If residual electrons are purged from the portion of the NAND channel adjacent to the next memory cell to be sensed then the word line voltage creep up problem may be mitigated or eliminated.

Embodiments disclosed herein provide techniques for accurately sensing again immediately (or at least very soon) after a sensing operation that does cause a shift in the threshold voltage distribution. In one embodiment, techniques are provided for "de-shifting" the threshold voltage distributions. Thus, the shifted threshold voltage distributions 810-817 may be shifted back to the threshold voltage distributions 800-807 without having to wait for the crept up word line voltage to die down (and hence wait for the shifted threshold voltage distributions 810-817 to return to the former threshold voltage distributions 800-807). In one embodiment, de-shifting the threshold voltage distributions comprises performing a weak erase operation. In one embodiment, the weak erase operation is part of a read operation. The weak erase is to at least the next memory cell(s) to be sensed, in one embodiment. However, all memory cells on the NAND string(s) could be weakly erased to remove the trapped electrons.

Figure 9:
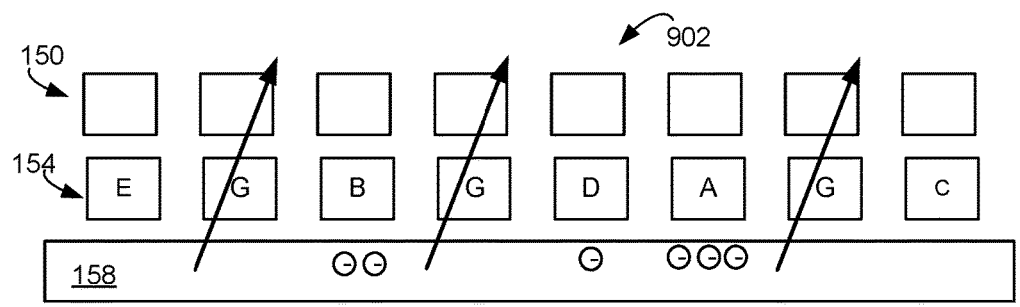
FIG. 9 is a diagram of a portion of a string of memory cells, which will be used to discuss a problem of residual electrons getting trapped in the channel.

FIG. 9 is a diagram of a portion of a string 902 of memory cells, which will be used to discuss a problem of residual electrons getting trapped in the channel 158. The memory cells each have a control gate 150 and a charge storage region 154. The memory cells could be part of a NAND string. The entire NAND string has not been depicted in FIG. 9. There may be a source side select gate at one end that is connected to a common source line, and a drain side select gate at the other end that is connected to a bit line. The letters on the charge storage regions 154 indicate the state to which that memory cell has been programmed, with reference to the data states of FIG. 8A. Several of the memory cells have been programmed to the G-state.

To sense one of the memory cells on the string, one of the read reference voltages from FIG. 8A may be applied to the control gate of the memory cell that has been selected for reading ("selected memory cell). A read pass voltage (e.g., Vread) may be applied to the control gates of the other memory cells ("unselected memory cells). The read pass voltage has a sufficient magnitude to turn on a memory cell regardless of which of the states to which it has been programmed. When the memory cell is "turned on" the channel adjacent to the memory cell is conductive. Just after the sensing operation, the read reference voltage applied to the control gate of the selected memory cell may be increased to the read pass voltage. Thus, for a brief period all of the control gates may have the read pass voltage applied thereto. Thus, all of the memory cells will be in the conductive state (or "turned on").

For the sake of illustration, the following example will assume that the read pass voltage is brought down at the same time on all of the control gates. At some point, the control gate voltage on the memory cells programmed to the G-state will drop low enough for those memory cells to turn off (or become non-conductive). At that point, the control gate voltage on other memory cells is still high enough for those memory cells to be conductive. FIG. 9 is a snapshot of the point at which the memory cells programmed to the G-state have just become non-conductive. This may correspond to the point when the control gate voltages have dropped to about VvG. At that point, the memory cell in the A-state is still be strongly conductive, as indicated by the large number of electrons in the channel 158 adjacent to the A-state memory cell. The B-state memory cell is also conductive, as indicated by the electrons in the channel 158 adjacent to the B-state memory cell. The D-state memory cell may be more weakly conductive, as indicated by a single electron in the channel 158 adjacent to the D-state memory cell. Of course, the number of electrons is just for purpose of comparison, the actual number of electrons will be different from depicted. These electrons in the channel 158 may be referred to as "residual electrons".

When the memory cells programmed to the G-state are no longer conductive, the residual electrons (from other conductive memory cells) may become trapped in the channel 158. For example, the residual electrons in the channel 158 adjacent to the B-state memory cell may be trapped due to the fact that the memory cells on each side of the B-state memory cell are off. Similarly, the residual electrons adjacent to the D-state and A-state memory cell may be trapped in the channel. Note that the voltage on the control gates of the A-state and D-state memory cells may eventually become low enough to turn off those memory cells. However, the residual electrons will still be trapped in the channel 158.

As noted with respect to FIG. 1A, it is possible for the word line voltage (and thus control gate voltage) to creep up after the sensing operation. As noted with respect to FIG. 1B, an electric field can cause residual electrons in the channel 158 to be drawn to shallow interface traps in, for example, a charge trapping layer 154. Such residual electrons could be trapped in the shallow interface traps, thereby impacting the threshold voltage of the memory cell. In some embodiments, residual electrons are purged from the channel 158 such that they do not become trapped in the shallow interface traps of memory cells on the string. In some embodiments, residual electrons are purged from at least a portion of the channel 158 such that they do not become trapped in the shallow interface traps of at least one of the memory cells on the string.

FIGS. 10A-10G are diagrams of a string 1002 of memory cells, which will be used to illustrate how residual electrons can be prevented from becoming trapped in the channel 158 after one embodiment of a sensing operation. For the sake of illustration there are eight memory cells and a select gate at each end of the NAND string. The source end has a source side select gate (SGS). The drain end has a drain side select gate (SGD). Note that this may be one of many NAND strings that are connected to the same word lines and select lines. Thus, the SGS may refer to a source side select line that connects to many NAND strings. Likewise, the SGD may refer to a drain side select line that connects to many NAND strings. The various control gates 150 (one of which is referenced in FIG. 10A) may be implemented as word lines that connect to the afore-mentioned many NAND strings. There could be more or fewer than eight memory cells. There might also be one or more dummy memory cells near the select gates.

In some embodiments, each of the memory cells is associated with one layer of a stack. For example, in FIG. 4C, memory cells are associated with layers WLL0-WLL47. Likewise, dummy memory cells may be associated with a layer of the stack. Also note that the select gates can be distributed over one or more layers of the stack. For example, in FIG. 4C, the drain side select gate is distributed over two layers (SGD0, SGD1). Likewise, the source side select gate is distributed over two layers (SGS0, SGS1).

The memory cells in FIGS. 10A-10G are divided into groups. The middle two memory cells are in Group 0. Group 1 comprises the memory cells on both the drain side and source side. Group 2 comprises the next memory cells on both the drain side and source side. Group 3 comprises the next memory cells on both the drain side and source side. There may be more or fewer than four groups. Also, there could be more than two memory cells per group.

Figure 10:
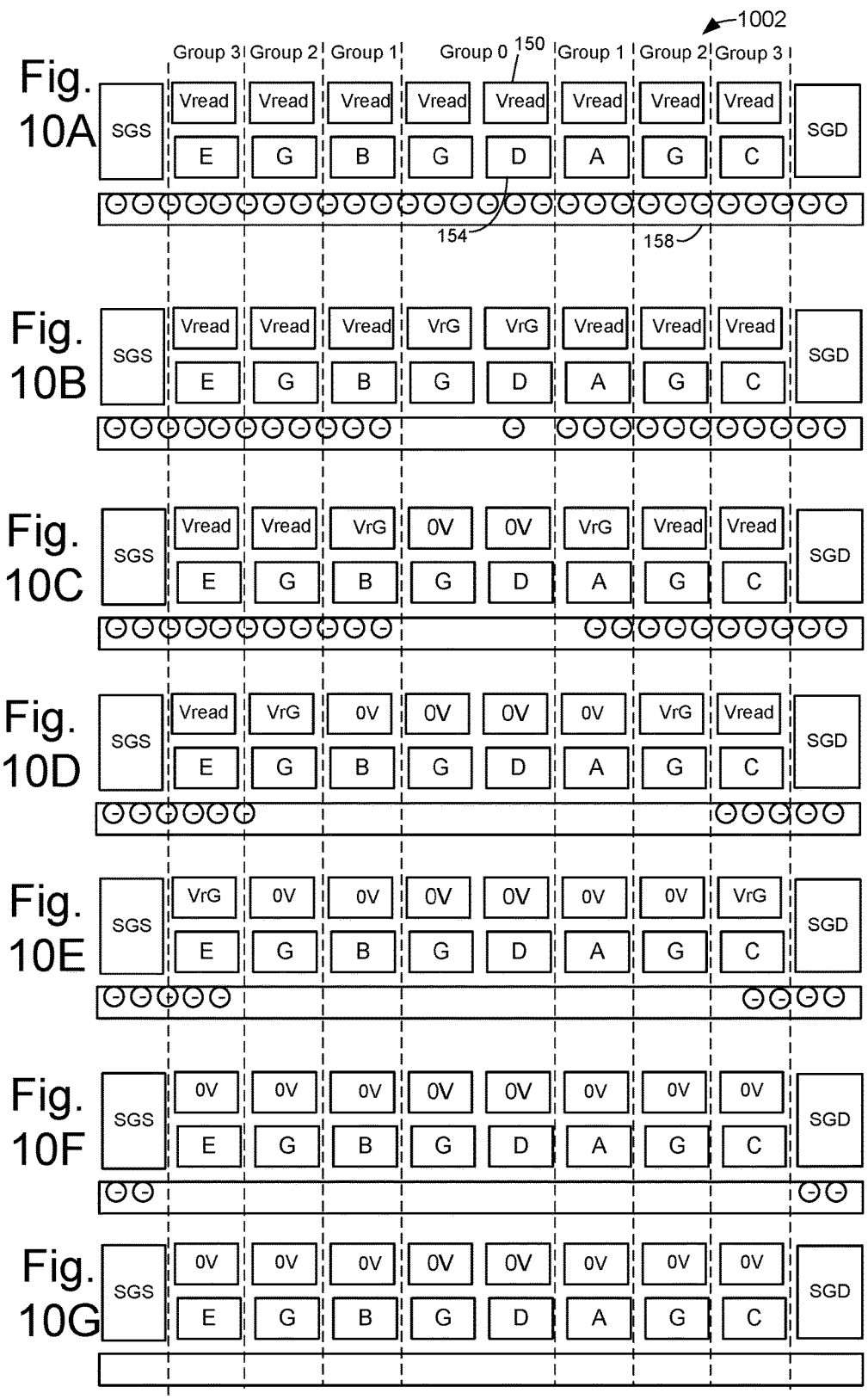
FIGS. 10A-10G are diagrams of a string of memory cells to illustrate how residual electrons can be prevented from becoming trapped in the channel after one embodiment of a sensing operation.
Figure 11:
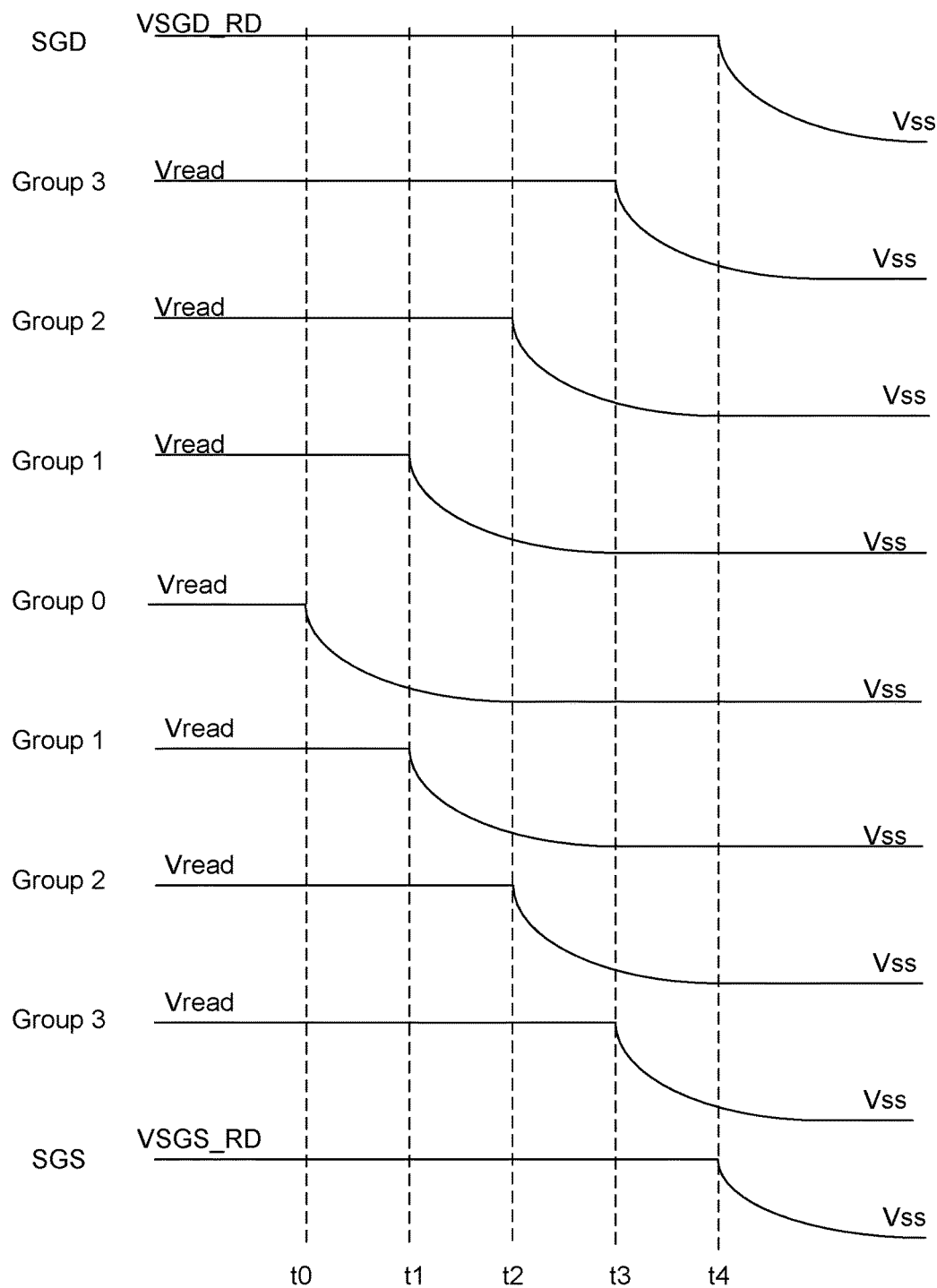
FIG. 11 shows timing diagram for one embodiment of discharging Vread on the control gates of the memory cells of FIGS. 10A-10G.

FIG. 11 shows timing diagram for one embodiment of discharging Vread on the control gates of the memory cells of FIGS. 10A-10G. FIG. 11 shows that at time t0, Vread starts to be discharged on the control gates of memory cells in Group 0, while Vread is maintained on the other control gates. The voltage on both SGS and SGD is at a level to keep each select gate conductive. FIG. 10A shows the condition for time t0, in accordance with one embodiment. At time t0, Vread is applied to the control gates of all of the memory cells. Thus, all memory cells are in the conductive state. The channel 158 is conductive adjacent to each memory cell.

FIG. 11 shows that at time t1, Vread starts to be discharged on the control gates of memory cells in Group 1, while Vread is maintained on the control gates of Group 2 and Group 3 memory cells. The voltage on both SGS and SGD is at the level to keep each select gate conductive.

FIG. 10B shows the condition for time t1, in accordance with one embodiment. The voltage on the control gates of the Group 0 memory cells has dropped to about VrG. Referring to FIG. 8A, VrG is the read reference voltage for the G-state. Thus, the G-state memory cell in Group 0 is no longer conductive. Any residual electrons that may have been in the channel 158 adjacent to the G-state memory cell in Group 0 can migrate to either the source or drain end of the string 1002. The D-state memory cell in Group 0 is still conductive. Also, the memory cells in Groups 1-3 are all still conductive.

FIG. 11 shows that at time t2, Vread starts to be discharged on the control gates of memory cells in Group 2, while Vread is maintained on the control gates of Group 3 memory cells. The voltage on both SGS and SGD is at the level to keep each select gate conductive.

FIG. 10C shows the condition for time t2, in accordance with one embodiment. The voltage on the control gates of the Group 0 memory cells has dropped to about 0V. The voltage on the control gates of the Group 1 memory cells has dropped to about VrG. Any residual electrons that may have been in the channel 158 in Group 0 can migrate to either the source or drain end of the string 1002.

FIG. 11 shows that at time t3, Vread starts to be discharged on the control gates of memory cells in Group 3. The voltage on both SGS and SGD is at the level to keep each select gate conductive.

FIG. 10D shows the condition for time t3, in accordance with one embodiment. The voltage on the control gates of the Group 0 and Group 1 memory cells has dropped to about 0V. The voltage on the control gates of the Group 2 memory cells has dropped to about VrG. The A-state and B-state memory cells in Group 1 may shut off prior to the memory cells in Group 2. Therefore, any residual electrons that may have been in the channel 158 adjacent to the A-state memory cell in Group 1 can migrate to the drain end of the string 1002. Any residual electrons that may have been in the channel 158 adjacent to the B-state memory cell in Group 1 can migrate to the source end of the string 1002. When the G-state memory cells in Group 2 shuts off, any residual electrons in one of the G-state memory cells have a path to the source end of the NAND string 1002, and the residual electrons in the other G-state memory cell have a path to the drain end of the NAND string 1002.

FIG. 11 shows that at time t4, the voltage on the source and drain side select gates begins to be discharged. FIG. 10E shows the condition for time t4, in accordance with one embodiment. The voltage on the control gates of the Group 0, Group 1 and Group 2 memory cells has dropped to about 0V. The voltage on the control gates of the Group 3 memory cells has dropped to about VrG. In this case, the E-state memory cell and the C-state memory cell in Group 3 are each still conductive. The source side select gate (SGS) and drain side select gate (SGD) are still conductive. Hence, electrons from Group 3 still have an exit path from the channel 158.

FIG. 10F shows the condition for time t5, in accordance with one embodiment. The voltage on the control gates of the Group 0-Group 3 memory cells has dropped to about 0V.

Hence, these memory cells are no longer conductive. However, any residual electrons from Group 3 are purged from the NAND channel 158 because both the source side select gate (SGS) and drain side select gate (SGD) are still conductive.

FIG. 10G shows the condition for time t6, in accordance with one embodiment. At this time, the source side select gate (SGS) and the drain side select gate (SGD) are no longer conductive. However, residual electrons have been purged from the channel 158. Because residual electrons have been purged from the channel 158, the amount of residual electrons trapped in memory cells is reduced or eliminated. Thus, any of the memory cells could be accurately sensed without a need to wait for the residual electrons to de-trap from memory cells For example, any of the memory cells could be accurately sensed without a need to wait for a crept up word line voltage to subside. Note that it is not required that all residual electrons be purged from the channel 158. Reducing the number of residual electrons in the channel 158 reduces problems associated with word line voltage creep up. Also, strategically reducing or eliminating the residual electrons from a portion of the channel 158 reduces or eliminates problems associated with word line voltage creep up for at least memory cells on that portion of the channel 158.

Note that the rate at which Vread is discharged from the control gates could be more rapid or slower than depicted in FIG. 11. Also note that it is not required that, for a given Group, Vread begins to be discharged at the same time for the memory cells on the drain side of Group 0 as for the source side of Group 0. For example, FIG. 11 depicts that Vread begins to be discharged at time t1 for Group 1 on both the drain side and the source side of Group 0. Both do not need to be discharged at time t1. However, Group 1 on the drain side should begin to be discharged after Group 0 and prior to Group 2 on the drain side. Likewise, Group 1 on the source side should begin to be discharged after Group 0 and prior to Group 2 on the source side.

In the example of FIGS. 10A-10G, there are four Groups. There could be more or fewer than four Groups. In the example of FIGS. 10A-10G, there are two memory cells (on the string) per Group. In some embodiments, there are more than two memory cells (on the string) per Group. In one embodiment, there is a single memory cell (on the string) per Group. The example of Table I describes one way in which the various conducting layers in the example of FIG. 2C might be divided up into groups.

TABLE I

| Group | Conductive Layers | Discharge order |
|---|---|---|
| 0 | WLL22-WLL25 | First |
| 1 | WLL20-WLL21, WLL26-WLL27 | Second |
| 2 | WLL18-WLL19, WLL28-WLL29 | Third |
| 3 | WLL16-WLL17, WLL30-WLL31 | Fourth |
| 4 | WLL14-WLL15, WLL32-WLL33 | Fifth |
| 5 | WLL12-WLL13, WLL34-WLL35 | Sixth |
| 6 | WLL10-WLL11, WLL36-WLL37 | Seventh |
| 7 | WLL08-WLL09, WLL38-WLL39 | Eighth |
| 8 | WLL06-WLL07, WLL40-WLL41 | Ninth |
| 9 | WLL04-WLL05, WLL42-WLL43 | Tenth |
| 10 | WLL02-WLL03, WLL44-WLL45 | Eleventh |
| 11 | WLLS0-WLL01, WLL46-WLL47 | Twelve |
| 12 | DWLS0, DWLS1, DWLD1, DWLD0 | Thirteenth |
| 13 | SGS0, SGS1, SGD1, SGS0 | Fourteenth |

In the example of Table I, there are four conductive layers per group. There could be more or fewer than four conductive layers per group. It is not required that all of the groups be of the same size. That is, the number of conductive layers could be different is some groups than others. There are many variations in how the conductive layer may be grouped. In one embodiment, the dummy word lines and select gates are placed in the same group.

In the example of Table I, Groups 1-13 each contain conductive layers on both the drain side and the source side of Group 0. This is not an absolute requirement. For example, Group 1 might be divided into Group 1A having WLL20-WLL21 and Group 1B having WLL26-WLL27. Group 1A and Group 1B are not required to be discharged at the same time. However, Group 1A should begin their discharge prior to the discharge of any of WLL00-WLL17 (as well as DWLS0, DWLS1 and SGS0, SGS1. Likewise, Group 1B should begin their discharge prior to the discharge of any of WLL28-WLL47 (as well as DWLD1, DWLD0 and SGD1, SGD0).

Figure 12:
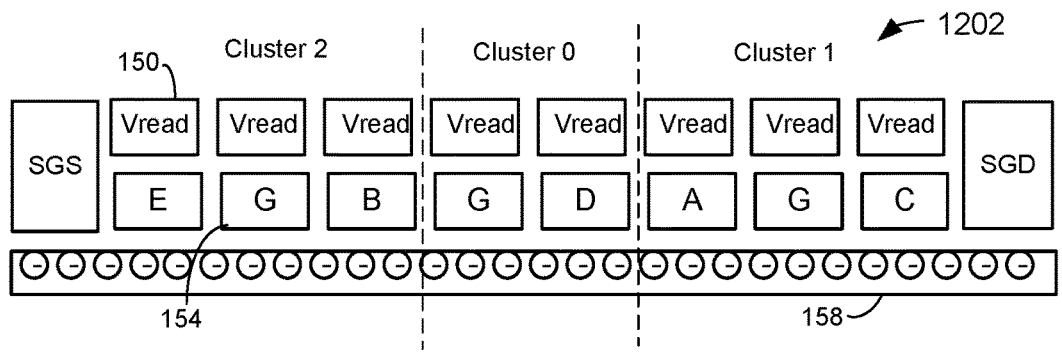
FIG. 12 depicts one example in which the word lines are divided into three clusters.

Herein, the term "cluster" is used to refer to a contiguous set of word lines (or a contiguous set of control gates). For example, WLL20-WLL21 are an example of a cluster. There may be one or more word lines in a cluster. FIG. 12 depicts one example in which the memory cells on a string 1202 are divided into three clusters. Another way of expresses this is to refer to word lines associated with the memory cells on the string being divided into clusters. The string 1202 is consistent with the string 1002 of FIGS. 10A-10F. In FIG. 12, the middle two memory cells are in Cluster 0. Cluster 1 contains all of the memory cells between Cluster 0 and SGD. Cluster 2 contains all of the memory cells between Cluster 0 and SGS. In one embodiment, the read pass voltage on Cluster 0 is begun to be discharged prior to beginning to discharge the read pass voltage on any memory cell in Cluster 1 or Cluster 2. Also, SGS and SGD have a sufficient voltage applied to their gates to keep them in a conductive state. Therefore, any residual electrons in the channel 158 adjacent to the memory cells in Cluster 0 may be purged from the channel. Either of the memory cells in Cluster 0 may be sensed again, without needing to wait for a crept up voltage to die down.

Figure 13:
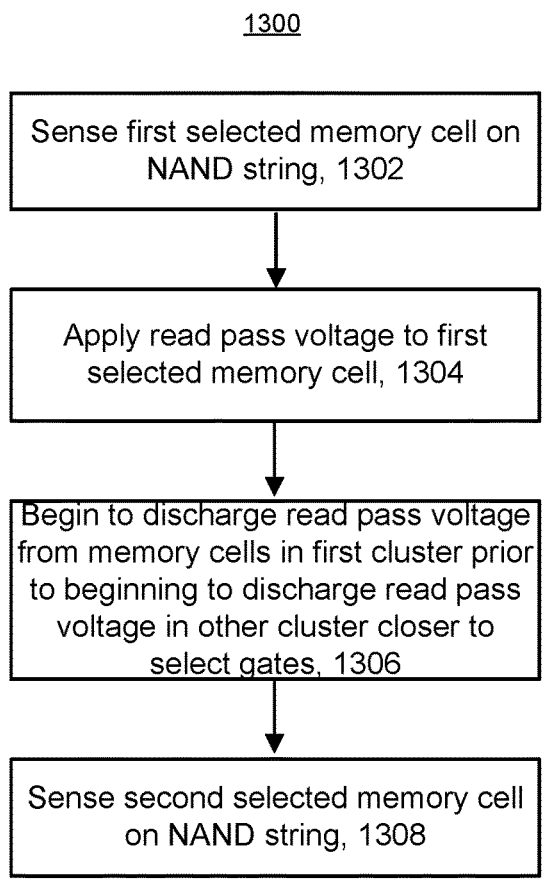
FIG. 13 is a flowchart of one embodiment of a process of sensing memory cells in which residual electrons are purged from a channel.

FIG. 13 is a flowchart of one embodiment of a process 1300 of sensing memory cells in which residual electrons are purged from a channel. The process 1300 may be used to sense one or more memory cells on a NAND string. The NAND string may be in a 3D architecture or a 2D architecture. In one embodiment, the memory cells have charge trapping layers. The sensing operation is a program verify, in one embodiment. The sensing operation is a read, in one embodiment. Process 1300 describes sensing a first selected memory cell and a second selected memory cell. The second selected memory cell and the first selected memory cell may be the same memory cell, or two different memory cells on the same string (e.g., NAND string). The NAND string may be one of many NAND strings that share word lines and select lines. The process can be performed in parallel with respect to the many NAND strings. Process 1300 is performed by control circuit (e.g., the control circuit may include any one of, or a combination of, control circuitry 110, state machine 112, decoders 114/132, power control module 116, sense blocks SB1, SB2, . . . , SBp, read/write circuits 128, controller 122, and so forth), in one embodiment.

The NAND string may have a source select gate at a one end and a drain select gate at another end of the NAND string. The control gates may include a first cluster of control gates, one or more clusters of control gates between the first cluster and the first select gate, and one or more clusters of control gates between the first cluster and the second select gate. For example, the first cluster of control gates could be those in Cluster 0 in FIG. 12. The one or more clusters of control gates between the first cluster and the first select gate could be those in Cluster 1. The one or more clusters of control gates between the first cluster and the second select gate could be those in Cluster 2.

As another example, the first cluster of control gates could be those in Group 0 in FIGS. 10A-10G. The one or more clusters of control gates between the first cluster and the first select gate could be those in Groups 1, 2, and 3, and that are on the drain side of Group 0. The one or more clusters of control gates between the first cluster and the second select gate could be those in Groups 1, 2, and 3, and that are on the source side of Group 0.

In step 1302, a first selected non-volatile storage element on a selected NAND string is sensed. Note that the first selected non-volatile storage element could be in any of the clusters. In one embodiment, the sensing is a read operation. In one embodiment, the sensing is a program verify operation. Step 1302 may comprise applying a read pass voltage to control gates of unselected non-volatile storage elements of the selected NAND string while applying a reference voltage to the first selected non-volatile storage element. The reference voltage may be a read reference voltage, a program verify voltage, etc. The read pass voltage is high enough to put the unselected memory cells in a conductive state so they do not interfere with the sensing of the selected memory cell. The read pass voltages that are applied to the unselected memory cells could each be the same magnitude. However, note that the magnitude of the read pass voltage applied to different memory cells could be different. Step 1302 may also include applying a turn-on voltage to the SGD and SGS select gates for the selected NAND string. This allows a current to flow in the selected NAND strings to sensing circuitry.

In step 1304, a read pass voltage is applied to the control gate of the first selected non-volatile storage element after the first selected non-volatile storage element is sensed. Step 1304 may include raising the reference voltage to the read pass voltage.

In step 1306, the read pass voltage is begun to be discharged from the control gates of the first cluster prior to beginning to discharge the read pass voltage from the control gates in any of the other cluster and while the first select gate and the second select gate are in a conductive state. For example, referring to FIG. 11, at time t0, the read pass voltage is begun to be discharged from Group 0. Also, the read pass voltages for Groups 1-3 have not yet begun to discharge. Also, note that in FIG. 11, the SGD and SGS still have a voltage applied that puts them in a conductive state. Note that the first cluster may or may not include the first selected memory cell.

In one embodiment, step 1306 includes keeping all non-volatile storage elements between the first cluster of control gates and the first select gate of the NAND string turned on and keeping all non-volatile storage elements between the first cluster of control gates and the second select gate of the NAND string turned on until the control gate voltage in the first cluster has discharged to the steady state voltage. For example, all of the non-volatile storage elements in Cluster 1 and all of the non-volatile storage elements in Cluster 2 are kept in a conductive state (or kept on) until the control gate voltage on all non-volatile storage elements in the Cluster 0 has discharged to a steady state voltage (e.g., Vss), with reference to FIG. 12. with Using the example of FIGS. 10A-10G, all of the non-volatile storage elements in Groups 1-3 on the drain side of Group 0, and all of the non-volatile storage elements in Groups 1-3 on the source side of Group 0 are kept in a conductive state (or kept on) until the control gate voltage on all non-volatile storage elements in the Group 0 has discharged to a steady state voltage (e.g., Vss).

In one embodiment, step 1306 includes beginning to discharge the read pass voltage from the control gates of the one or more clusters of control gates between the first cluster and the first select gate in order of the clusters going from the cluster nearest the first cluster to the cluster nearest the first select gate. For example, with reference to the example of FIGS. 10A-10G (and FIG. 11), the order in which the read pass voltage is begun to be discharged with respect to Groups on the drain side of Group 0 is: Group 1, Group 2, Group 3. Likewise, the order in which the read pass voltage is begun to be discharged with respect to Groups on the source side of Group 0 is: Group 1, Group 2, Group 3.

In one embodiment, step 1306 includes beginning to discharge the read pass voltage from a cluster of control gates adjacent to the first cluster of control gates prior to the voltage on the control gates in the first cluster reaching the steady state voltage. Referring to FIG. 11, note that it is not necessary to wait for the voltage on, for example Group 0, to go all of the way to the steady state voltage (e.g., Vss) prior to beginning to discharge the voltage on the adjacent Group 1 (the adjacent cluster could be the Group 1 on either the source side or the drain side of Group 0). This helps to speed up the overall sensing operation. Thus, at time t1, Vread may begin its discharge from Group 1 prior to the voltage on the control gates of Group 0 reaching Vss.

In one embodiment, step 1306 includes beginning to discharge the read pass voltage from a cluster adjacent to the first cluster prior to all of the non-volatile storage elements in the first cluster going from a conductive state to a non-conductive state. This may also help to speed up the overall sensing operation in that it is not required to wait until all of the non-volatile storage elements in Group 0 turn off prior to beginning to discharge Group 1, using FIGS. 10A-10G as an example. FIG. 10B shows one example of conditions at the time when the voltage on Group 1 just begins to discharge. At this time, the voltage on control gates of Group 0 may be at about VrG. At this time, some of the memory cells in Group 0 may be off (e.g., G-state cells may be off). However, assuming that there are memory cells in other states (such as the depicted D-state cell), that memory cell may still be on. Thus, it is not necessary to wait for the D-state memory cell in Group 0 to be non-conductive to begin to discharge Group 1, as one example.

In step 1308, a second selected non-volatile storage element on the selected NAND string is sensed after the read pass voltage on the control gates of memory cells in all of the clusters has reached a steady state voltage. The second selected non-volatile storage element could be in any of the clusters. In one embodiment, the second selected non-volatile storage element is in Cluster 0. Thus, the second selected non-volatile storage element may be in the first cluster to be discharged. Step 1308 is a read operation, in one embodiment. However, step 1308 is not limited to a read operation. Note that between step 1306 and 1308, the read pass voltages on the memory cells in other than the first cluster is begun to be discharged. For example, at time t1 in FIG. 11, the read pass voltage for Group 1 begins to discharge. Prior to sensing the second selected memory cell in step 1308, the read pass voltage on the control gates of memory cells in all of the groups has reached a steady state voltage. For example, the read pass voltage may reaches Vss for all memory cells on the NAND string.

Although some examples provided herein have a symmetrical grouping, this is not required. With respect to the example of FIG. 12, it is not required for the size of Cluster 1 and Cluster 2 to be the same size. In other words, it is not required that Cluster 0 be in the middle of the string 1202. With respect to the example of FIGS. 10A-10G, it not required that Group 0 is in the middle of the string. In other words, it is not required for the total number of memory cells in Group 1-3 to be the same size on each side of Group 0. Likewise, it is not required to have the same number of groups on each side of Group 0.

As noted above, there could be one or more word lines in a cluster (or in a group). Having fewer word lines in a cluster (or in a group) may increase accuracy. However, fewer word lines in a cluster (or in a group) means that there will be more clusters (or groups). Hence, the sensing operation could take longer to discharge the word lines in the sequential fashion discussed herein. On the other hand, having more word lines in a cluster (or in a group) may increase efficiency. For example, more word lines in a cluster (or in a group) can allow for fewer clusters (or groups), which may allow for a faster sequential discharge.

Figure 14:
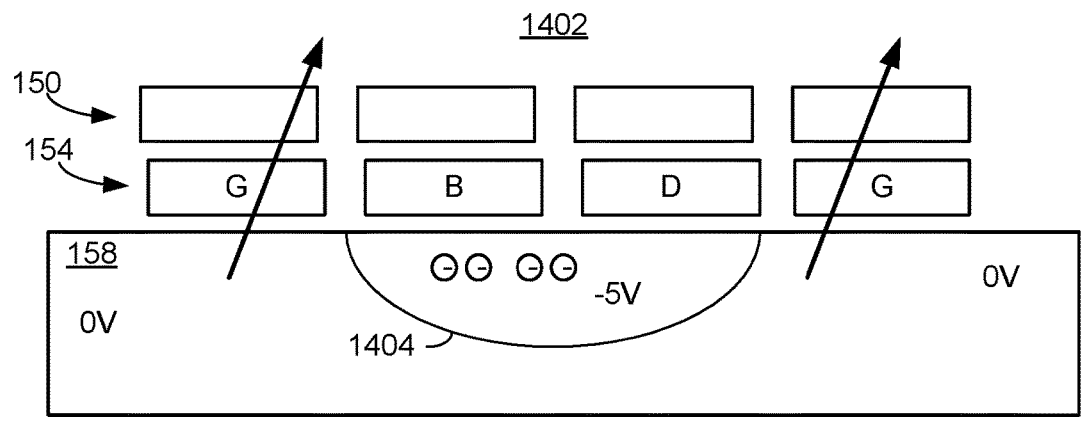
FIG. 14 depicts a portion of a string of memory cells to illustrate a temperature effect.

In one embodiment, the number of word lines (or the number of memory cells) that are in a cluster (or group) depends on the present temperature. In one embodiment, the lower the temperature, the fewer word lines are placed in a cluster (or group). A rationale for this temperature dependent cluster size (or group size) is as follows. FIG. 14 depicts a portion of a string 1402 of memory cells. Each memory cell has a control gate 150 and a charge storage region 154. The charge storage region 154 is a charge trapping region, in one embodiment. The channel 158 adjacent to the memory cells is formed from polysilicon, in one embodiment. The letters on the charge storage region 154 refer to the state of the memory cell, with reference to FIG. 8A. All four of the memory cells are in the same cluster. Thus, the read pass voltage starts to discharge at the same time for all of the memory cells in FIG. 14. The G-state memory cells will turn off prior to the B-state and D-state memory cells. Therefore, at least temporarily there may be some residual charges in the channel 158 adjacent to the B-state and D-state memory cells.

However, even after the control gate voltage of all of the memory cells in the depicted cluster reaches the steady state voltage, memory cells in adjacent clusters may still be on. At this time, the channel potential in the pocket 1404 with the residual electrons could be, for example, −5V. The channel potential elsewhere could be, for example, 0V. Significantly, the potential difference between the pocket 1404 and adjacent portions of the channel 158 may result in electron-hole generation. This may result in holes recombining with electrons in the pocket 1404. Hence, at least some of the residual charges may be removed from the channel 158. The rate of electron-hole may be a function of temperature. More electron-hole pairs are created with increasing temperature (at least for polysilicon).

Figure 15:
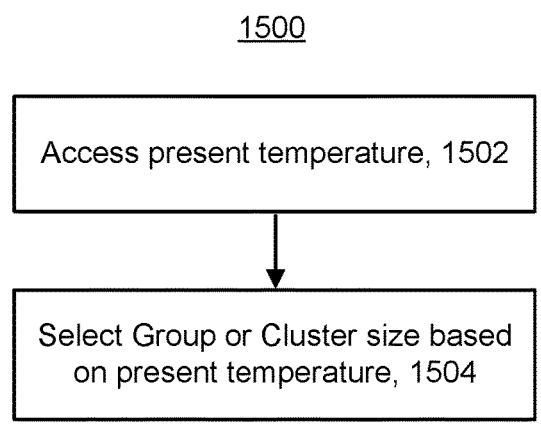
FIG. 15 is one embodiment of a process of selecting a group or cluster size based on present temperature.

FIG. 15 is one embodiment of a process 1500 of selecting a group or cluster size based on present temperature. Process 1500 may be performed prior, or during, process 1300. Step 1502 includes accessing the present temperature. Step 1504 includes selecting a group or cluster size based on the present temperature. Step 1504 may be realized in a variety of ways. One way is to store a number of tables that each allocate word lines to groups. One of the tables may be selected based on present temperature. Another way is for processor 122c to execute an algorithm that determines a suitable number of word lines per cluster, based on temperature. The algorithm may alternatively determine how many clusters (or groups) should be used. Process 1500 is performed by control circuit, in one embodiment.

In one embodiment, the decision of which word line to ramp down first is based on which word line is to be selected next for a sensing operation. A rationale for is that if the next word line to be sensed is ramped down first, residual charge carries can be purged from the adjacent channel region of that word line. Even if there are residual electrons in other parts of the channel, this might not impact accuracy of the next sensing operation.

Figure 16:
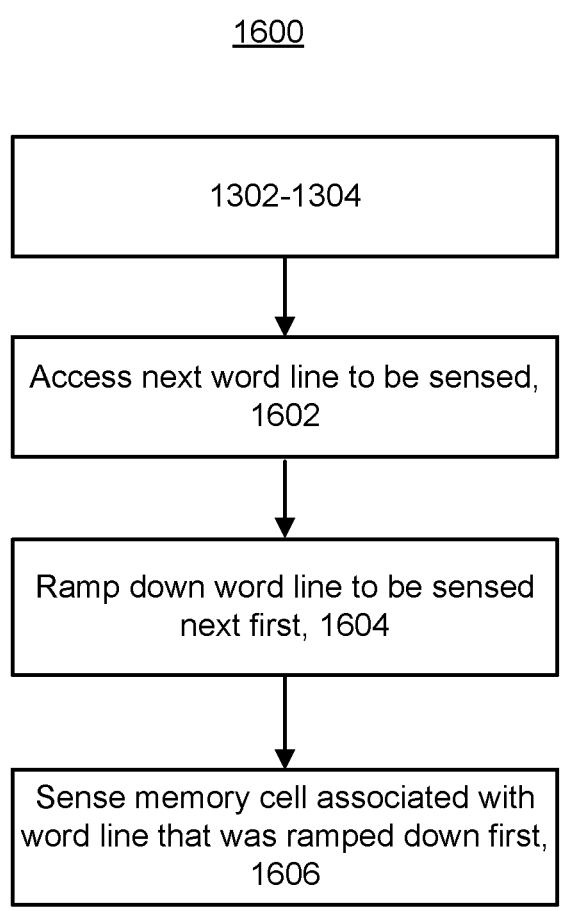
FIG. 16 is a flowchart of one embodiment of a process of first ramping down the next word line to be sensed.

FIG. 16 is a flowchart of one embodiment of a process 1600 of first ramping down the next word line to be sensed. Process 1600 is a variation of process 1300 of FIG. 13. Process 1600 is performed by control circuit, in one embodiment. Steps 1302-1304 are performed as a part of process 1600. In step 1602, the next word line to be sensed is accessed. For example, the controller 122 may have information to indicate what word line is to be sensed next. Step 1602 may be performed prior to steps 1302-1304.

Step 1604 includes beginning to discharge the next word line to be sensed in the first cluster (or group) of one or more word lines. With reference to FIG. 12, the next word line to be sensed is put into Cluster 0. However, Cluster 0 need not be in the middle of the string 1202. Cluster 0 includes the next word line to be sensed and may, optionally, include one or more adjacent word lines. Step 1604 is one embodiment of step 1306.

Step 1606 includes sensing a memory cell associated with the word line that was ramped down first. Step 1606 is one embodiment of step 1308.

Figure 17:
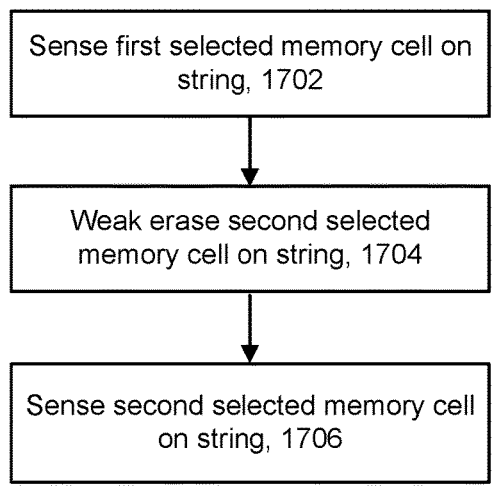
FIG. 17 is a flowchart of one embodiment of a process of sensing non-volatile storage, in which a weak erase is used.

In one embodiment, trapped electrons are removed (e.g., de-trapped) from the shallow interface traps of at least one of the memory cells on the string using a weak erase operation. FIG. 17 is a flowchart of one embodiment of a process 1700 of sensing non-volatile storage, in which a weak erase is used. The process 1700 includes sensing a first selected memory cell and a second selected memory cell on the same string (e.g., NAND string). The first and second selected memory cells may be the same memory cell or different memory cells on the same string. Each of the memory cells on the string have a control gate, in one embodiment. Each of the memory cells on the string is associated with a different word line, in one embodiment. The word line (or at least a portion of the word line adjacent to the memory cell) may serve as the control gate. Note that a word line may serve as a control gate for many different memory cells (on different strings). Process 1700 discusses operations on one string. Typically, many strings can be sensed in parallel. Process 1700 is performed by control circuit, in one embodiment.

Step 1702 includes sensing the first memory cell on the string. The sensing operation is a read operation in one embodiment. The sensing operation is a program verify operation in one embodiment. The sensing operation may include applying a read pass voltage to control gates of unselected memory cells on the string. In other words, the sensing operation may include applying a read pass voltage to unselected word lines associated with the string. While applying the read pass voltage to unselected word lines, a reference voltage is applied to a selected word line, in one embodiment. The reference voltage may be a read reference voltage, program verify voltage, etc. The first memory cell is sensed while the reference voltage is applied to its control gate. Afterwards, the reference voltage may be increased to a read pass voltage. Then, the read pass voltages on the selected word line and the unselected word lines may be discharged. Note that there is no special order in which the read pass voltages need to be discharged. For example, one option is to discharge the read pass voltages on all word lines at the same time. Thus, word line voltages may be brought from the read pass voltage to a steady state voltage (e.g., Vss) very quickly.

Step 1702 may result in the threshold voltage of the second memory cell changing from a first threshold voltage to a second threshold voltage. This change may be due to the impact of a word line voltage creep up, which may occur after the voltage on the word lines is brought down to the steady state voltage. It is possible for residual electrons in the string channel to become trapped in shallow interface traps in the memory cells. This could impact (e.g., increase) the threshold voltage of memory cells. One example this effect was discussed in connection with FIGS. 1A and 1B. FIG. 8B illustrates one possible change that could occur to the threshold voltage distribution of a group of memory cells. The second memory cell could be any memory cell in such a group. The amount of shift to the threshold voltage of the second memory cell may depend on the state to which it was programmed.

Step 1704 includes performing a weak erase of the second selected memory cell on the string. The weak erase may de-trap electrons that were trapped in shallow interface traps of the second memory cell. Thus, the weak erase may return the threshold voltage of the second memory cell back to the first threshold voltage, or at least very close to that level. In other words, the weak erase may return the threshold voltage of the second memory cell back to where it was prior to discharging the read pass voltage following sensing the first memory cell (and the associated trapping of electrons in shallow trap interfaces). It will be understood that the weak erase might not de-trap every trapped electron. Also, it is possible that the weak erase could remove some electrons from the charge trapping region 154 other than those that were trapped in the shallow interface traps as a result of sensing the first memory cell. Hence, the weak erase will not necessarily return the threshold voltage to exactly where is was prior to sensing the first memory cell. In one embodiment, the weak erase of the second selected memory cell is configured to remove electrons from the shallow trap interface that resulted from the word line creep up, without removing electrons that are in the charge trapping layer 154 as a result of programming the second selected memory cell.

Step 1706 includes sensing the second selected memory cell on the string, after performing the weak erase. In one embodiment, step 1706 includes reading the second selected memory cell. However, step 1706 is not limited to a read operation. Step 1706 is performed while the second selected memory cell still is at the first threshold voltage, in one embodiment. Here, the first threshold voltage refers to threshold voltage that was arrived at as a result of the weak erase.

In one embodiment, the weak erase in step 1704 is a "standalone" operation that is separate from operation that senses the second selected memory cell in step 1706. In one embodiment, the weak erase in step 1704 is a part of the operation that senses the second selected memory cell in step 1706. For example, the weak erase operation may be integrated into a read operation.

Figure 18A:
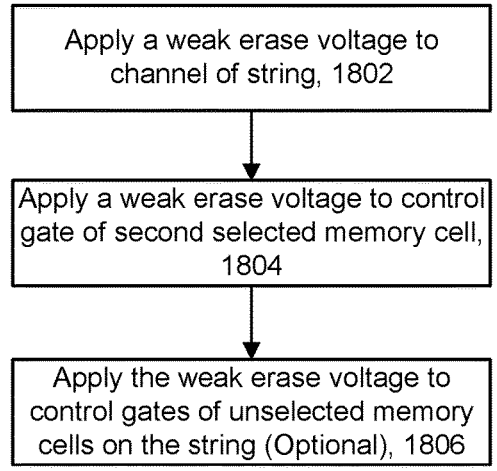
FIG. 18A is a flowchart of one embodiment of a process in which the weak erase operation is a standalone operation that is separate from operation that senses the second selected memory cell.

FIG. 18A is a flowchart of one embodiment of a process 1800 in which the weak erase operation is a standalone operation that is separate from operation that senses the second selected memory cell. Process 1800 is one embodiment of step 1704 of process 1700. Process 1800 is performed by control circuit, in one embodiment.

In step 1802, a weak erase voltage is applied to the channel of the string (e.g., NAND string). The channel weak erase voltage is about 6 Volts, in one embodiment. However, the channel weak erase voltage could be higher or lower in magnitude. In one embodiment, the channel weak erase voltage has a duration of between about 20 to 30 microseconds. However, the channel weak erase voltage could be applied for less than 20 microseconds or for longer than 30 microseconds.

In one embodiments, the weak erase voltage is applied to the substrate 101 below a 3D NAND structure. In one embodiments, the weak erase voltage is applied to a substrate below a 2D NAND string.

In one embodiment, the weak erase voltage is provided to the channel by way of the bit line and/or source line. One approach for the weak erase in a 3D stacked non-volatile memory device is to generate gate induced drain leakage (GIDL) current to charge up the NAND string channel, and raise the channel potential to the weak erase voltage. In one approach, the memory device includes NAND strings which have a drain-side select gate (SGD) transistor on one end and a source-side select gate (SGS) transistor on the other end. The weak erase may be a "one-sided weak erase" or a "two-sided weak erase." When a voltage is applied to the bit line in a one-sided v, or to the bit line and source line in a two-sided weak erase, the select gate transistors generate a sufficient amount of gate-induced drain leakage (GIDL) current to charge up the floating body (channel) of the NAND string. GIDL increases in proportion to the drain-to-gate voltage (Vdg) of the select gate transistors.

Figure 18B:
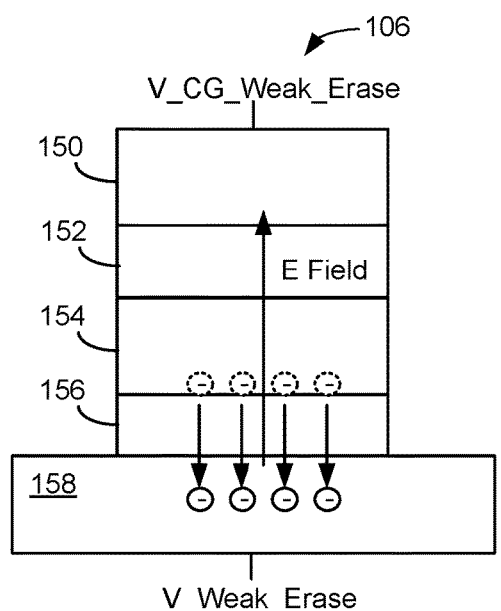
FIG. 18B depicts a memory cell undergoing a weak erase.

Step 1804 includes applying a weak erase voltage to the control gate of the second selected memory cell ("control gate weak erase voltage"). The control gate weak erase voltage has a lower magnitude than the channel weak erase voltage, in one embodiment. As one example, the control gate weak erase voltage could be 0 V. Referring to FIG. 18B, the channel weak erase voltage (V_Weak_Erase) and the control gate weak erase voltage (V_CG_Weak_Erase) result in an electric field (E Field) that is pointing from the channel 158 towards the control gate 150 of the memory cell 106. The electric field is of sufficient strength to cause the residual electrons in the shallow trap interfaces of the charge trapping layer 154 to de-trap and move to the channel 158, as indicated by the arrows in FIG. 18B. Thus, the threshold voltage of the second selected memory cell may be restored to its threshold voltage prior to the residual electrons becoming trapped in the shallow trap interfaces of the charge trapping layer 154.

Optional step 1806 is to apply the control gate weak erase voltage to control gates of unselected memory cells on the string. This may have a similar effect of de-trapping electrons from shallow trap interfaces of the unselected memory cells (which may also be impacted by the word line voltage creep up problem). However, it is not required that all of the memory cells on the string have the control gate weak erase voltage applied to their control gates. Another option is to float the control gates of memory cells other than the second selected memory cell. (Referred to now as "unselected memory cells".) Another options is to apply a different magnitude voltage to the control gates of the unselected memory cells than the voltage applied to the second selected memory cell. For example, the voltage applied to the control gates of unselected memory cells could generate a weaker E field than the E field in the second selected memory cell, in which case the erase will be even weaker for the unselected memory cells.

One way to determine suitable magnitudes for the channel weak erase voltage and the control gate weak erase voltage is based on an analysis of a set of threshold voltage distributions, such as those in FIG. 8B. Recall that FIG. 8B depicts threshold voltage distributions 800-807 prior to the impact of residual electrons being trapped in shallow trap interfaces, as well as threshold voltage distributions 810-817 after residual electrons are trapped in shallow trap interfaces. In one embodiment, the channel weak erase voltage and the control gate weak erase voltage are chosen such that the threshold voltage distributions are returned to threshold voltage distributions 800-807, or very close thereto. Due to factors such as each memory cells reacting somewhat differently to electric fields, the weak erase will not necessarily return the threshold voltage distributions exactly to the original threshold voltage distributions 800-807.

Figure 19:
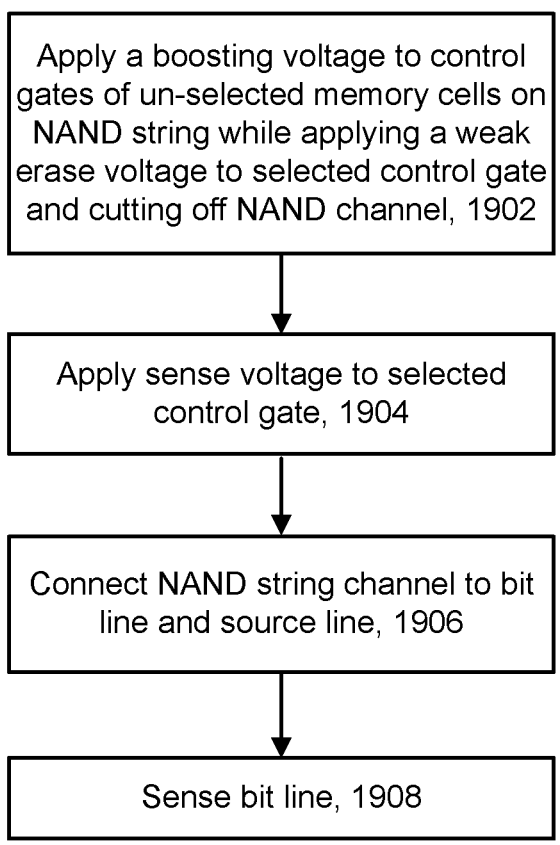
FIG. 19 is a flowchart of one embodiment of a process in which the weak erase operation is integrated into an operation that senses the second selected memory cell.
Figure 20A:
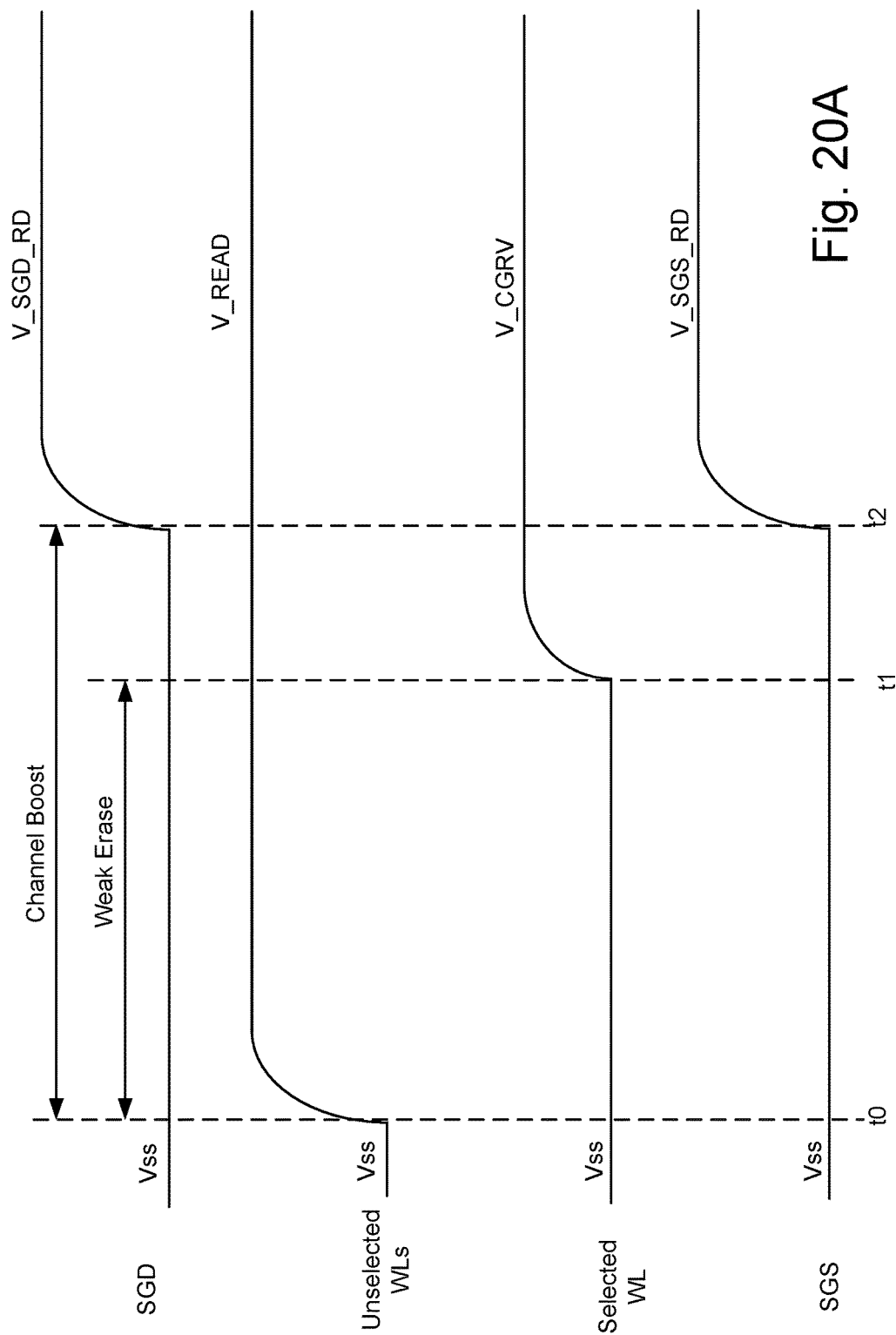
FIG. 20A is a timing diagram of signals applied to the string during one embodiment of process.

FIG. 19 is a flowchart of one embodiment of a process 1900 in which the weak erase operation is integrated into an operation that senses the second selected memory cell on the string. Process 1900 is part of a read operation, in one embodiment. However, process 1900 is not limited to a read operation. Process 1900 is performed by control circuit, in one embodiment. FIG. 20A is a timing diagram of signals applied to the string during one embodiment of process 1900. Referring briefly to FIG. 20A, signals that are applied to the drain side select line (SGD), the source side select line (SGS), unselected word lines (WLs), and the selected word line are depicted. Prior to time t0, these four signals are all at a steady state voltage (e.g., Vss). Prior to performing step 1902, the first selected memory cell on the string is sensed. For example, step 1702 from process 1700 may be performed. Sensing the first selected memory cell on the string may impact the threshold voltage of the second memory cells, as described with respect to step 1702. For example, the threshold voltage of the second memory cell may change from a first threshold voltage to a second threshold voltage.

Step 1902 includes applying a boosting voltage to control gates of un-selected memory cells on a NAND string while applying a weak erase voltage to a selected control gate of a selected non-volatile storage element of the NAND string and while cutting off a channel of the NAND string from a bit line and from a source line. The weak erase voltage is lower in magnitude than the boosting voltage, in one embodiment. The magnitude of the weak erase voltage is selected such that electrons are de-trapped from shallow interface traps of the selected memory cell.

Referring to FIG. 20A, at time t0, the voltage V_READ is applied to the unselected word lines (WLs). This is one example of applying a boosting voltage to control gates of un-selected memory cells on a NAND string. Also, between time t0 and t2, both SGS and SGD are at the steady state voltage (e.g., Vss), which keeps the source side select gate and the drain side select gate off. With the source side select gate off, the NAND string is disconnected from the source line. With the source drain select gate off, the NAND string is disconnected from the bit line. Thus, this is one example of cutting off a channel of the NAND string from a bit line and from a source line. Between time t0 and t1, the selected WL is at Vss. This is one example of applying a weak erase voltage to a selected control gate of a selected non-volatile storage element of the NAND string.

FIG. 20A shows that between times t0 and t2, the potential of the channel of the NAND string is boosted. The channel potential boosting results from having the boosting voltage applied to unselected word lines with the NAND channel cut off from the bit line and from the source line. Note that when the NAND channel is cut off from the bit line and from the source line it may float. Hence, the NAND channel may couple up towards the boosting voltage.

FIG. 20A shows that between time t0 and t1, a weak erase is performed. The length of the weak erase may be about 20 to 30 microseconds. However, the weak erase may be longer or shorter in duration. The weak erase may have a similar effect as was discussed for the memory cell of FIG. 18B. Thus, electrons that are trapped in shallow interface traps may be de-trapped. Such electrons may migrate to the channel 158, as a result of the electric field of the weak erase. The weak erase may change the threshold voltage of the second memory cell from the second threshold voltage back to the first threshold voltage, or at least close thereto.

Step 1904 includes applying a sense voltage to the selected control gate. Note that after the weak erase, the voltage on the selected word line may be raised to a read reference level. FIG. 20A depicts the voltage on the selected word line raising to V_CGRV at time t1. V_CGRV is of suitable magnitude to sense the selected memory cell. For example, V_CGRV could be one of the read reference levels in FIG. 8A.

Step 1906 includes connecting the NAND string channel to the bit line and to the source line. FIG. 20A shows that at time t2, the voltage on the drain select line (SGD) is raised to V_SGD_RD, which is of sufficient magnitude to turn on the drain side select gate of the selected NAND string. This connects the NAND string channel to the bit line. Also at time t2, the voltage on the source select line (SGS) is raised to V_SGS_RD, which is of sufficient magnitude to turn on the source side select gate of the selected NAND string. This connects the NAND string channel to the source line. The NAND channel is no longer floating, in one embodiment, due to voltages applied to the bit line and source line. Hence, the channel voltage may return from the boosted potential to a lower potential. In one embodiment, the channel voltage drops to about 0V.

Step 1908 includes sensing the bit line with the sense voltage (or read reference voltage) applied to the selected control gate. For example, a sense block may sense a voltage or current of the bit line. This sensing result may be stored. Note that other read reference voltages can also be applied to the selected word line. For example, after time t2, the voltage on the selected word line can be further increased to a different read reference voltage. After again sensing the bit line, the sensing result may be stored. In one embodiment, the memory cell is sensed at read reference levels VvA, VvB, VvC, VvD, VvE, VvF, and VvF. Then, a determination may be made which of the states (Er to G) the memory cell is in. This example is for purpose of one illustration, other read reference levels can be used.

In the example of FIG. 20A, the boosting voltage equals the read pass voltage. This is not required. Also, the boosting voltage need not be applied to all of the unselected word lines. Even with less than all of the unselected word lines receiving a boosting voltage, the channel can still be adequately boosted, at least near the selected word line. Also, the magnitude of the boosting voltage need not be the same for each unselected word line.

Figure 20B:
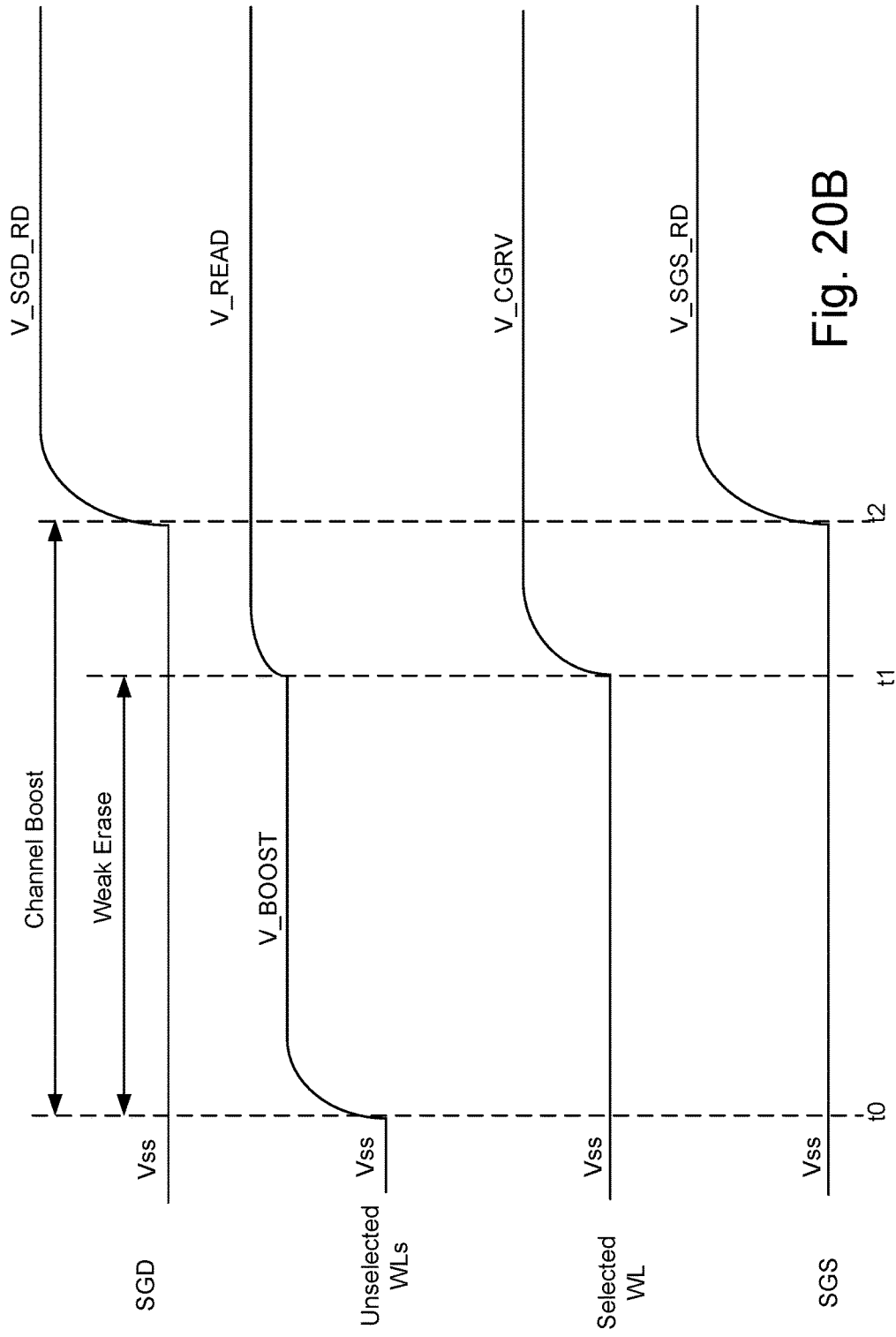
FIG. 20B depicts a timing diagram for an embodiment in which the boosting voltage does not equal the read pass voltage.

FIG. 20B depicts a timing diagram for an embodiment in which the boosting voltage does not equal the read pass voltage. This timing diagram can be used in connection with one embodiment of the process 1900 of FIG. 19. At time t0, unselected word lines are raised to a boosting voltage (V_BOOST), which is maintained until time t1. At time t1, the voltage on unselected word line is raised to V_READ. In this example, V_BOOST is lower in magnitude than V_READ. It is also possible for V_BOOST to be greater in magnitude than V_READ.

In some embodiments, the magnitude or duration of the weak erase depends on the present temperature. At higher temperatures, the strength of the weak erase can be lower and still adequately remove electrons trapped in the shallow interface traps. In one embodiment, the magnitude of a weak erase voltage is lower when the temperature is higher (and the magnitude of a weak erase voltage is higher when the temperature is lower). Here, the magnitude of a weak erase voltage refers to the magnitude of the voltage difference between the channel and the control gate. Another way to express the concept is that the magnitude of the electric field that results from applying the weak erase voltage(s) depends on temperature. In one embodiment, the duration of the weak erase is shorter when the temperature is higher (and longer when the temperature is lower). FIGS. 21A-21D provide a few examples to illustrate. The processes of FIGS. 21A-21D may be performed by control circuit.

Figure 21A:
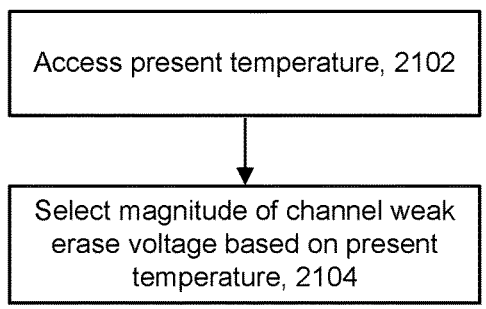
FIGS. 21A-21D provide a few examples to illustrate the magnitude or duration of the weak erase may depend on the present temperature.
Figure 21B:
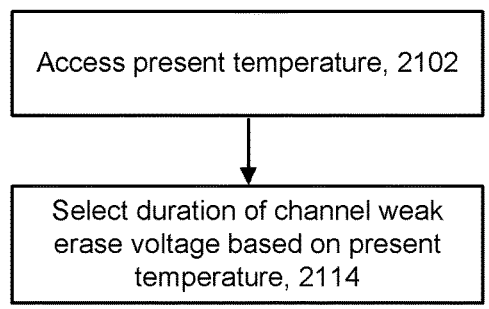

FIGS. 21A and 21B are for when the weak erase is a standalone operation. In step 2102 of process 2100 of FIG. 21A, the present temperature is accessed. In step 2104 of FIG. 21A, a magnitude of a channel weak erase voltage (e.g., V_Weak_Erase) is selected based on temperature. The magnitude of the control gate voltage (e.g., V_CG_Weak_Erase) could be constant with respect to temperature. Alternatively, the magnitude of both V_Weak_Erase and V_CG_Weak_Erase could depend on temperature. Still another possibility is for the magnitude of V_CG_Weak_Erase to depend on temperature and the magnitude of V_Weak_Erase to be constant with respect to temperature. Note that the magnitude of the weak erase voltage could be expressed as V_Weak_Erase–V_CG_Weak_Erase.

In step 2102 of process 2110 of FIG. 21B, the present temperature is accessed. In step 2114 of FIG. 21B, a duration of a channel weak erase voltage (e.g., V_Weak_Erase) is selected based on temperature. The duration of the control gate voltage (e.g., V_CG_Weak_Erase) does not need to depend on temperature. For example, V_CG_Weak_Erase might be 0V, with a duration that does not depend on temperature. However, one option is to have the duration of V_CG_Weak_Erase to depend on temperature and the duration of V_Weak_Erase to not depend on temperature. Alternatively, the duration of both V_Weak_Erase and V_CG_Weak_Erase could depend on temperature.

Figure 21C:
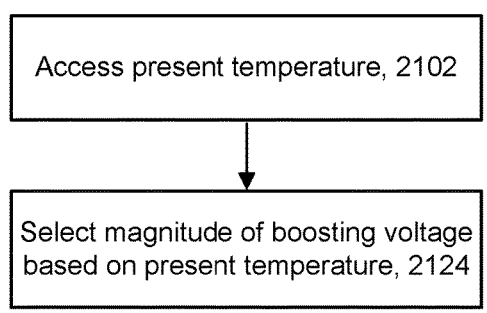
Figure 21D:
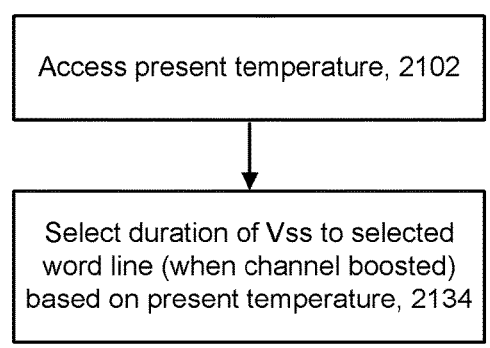

FIGS. 21C and 21D are for when the weak erase is integrated into the sense operation. In step 2102 of process 2120 of FIG. 21C, the present temperature is accessed. In step 2124 of FIG. 21C, a magnitude of a boosting voltage (e.g., V_BOOST in FIG. 20B) is selected based on temperature. The magnitude of the selected control gate voltage (e.g., voltage on the selected WL) could be constant with respect to temperature. For example, the voltage on the selected word line might be 0V from time t0 to t1 independent of temperature. Alternatively, the magnitude of both V_BOOST in FIG. 20B and the voltage on the selected word line from time t0 to t1 could depend on temperature. Still another possibility is for the magnitude of the voltage on the selected word line time t0 to t1 to depend on temperature and the magnitude of V_BOOST to be constant with respect to temperature.

In step 2102 of process 2130 of FIG. 21D, the present temperature is accessed. In step 2134 of FIG. 21D, a duration for which Vss is applied to the selected word line (when the channel is boosted) is selected based on temperature. Note that Vss is applied to the selected word line from time t0 to t1 in FIG. 20A (as well as 20B). Thus, the length of time between t0 and t1 may depend on the present temperature. Note that the weak erase may depend on a boosting voltage being applied to unselected word line. Thus, either Vread or V_BOOST may be applied to unselected word lines between t0 and t1. One way of articulating this process is that the duration in which both the boosting voltage being applied to unselected word lines and a low voltage (e.g., Vss) is applied to the selected word line may depend on temperature.

Many other variations of a temperature dependent weak erase are possible. In one embodiment, both the magnitude and the duration of the weak erase depend on temperature.

In one embodiment, a non-volatile storage device comprises: a NAND string of non-volatile storage elements and a control circuit in communication with the NAND string. The NAND string has a first select gate at a first end and a second select gate at a second end. The non-volatile storage elements each have a control gate. The control gates include a first cluster of control gates, one or more clusters of control gates between the first cluster and the first select gate, and one or more clusters of control gates between the first cluster and the second select gate. The control circuit is configured to sense a first non-volatile storage element on the NAND string, including the control circuit configured to apply a read pass voltage to the control gates of unselected non-volatile storage elements of the NAND string. The control circuit is configured to apply a read pass voltage to the control gate of the first non-volatile storage element after the first non-volatile storage element is sensed. The control circuit is configured to begin to discharge the read pass voltage from the control gates of the first cluster prior to beginning to discharge the read pass voltage from the control gates in any of the other clusters and while the first select gate and the second select gate are in a conductive state. The control circuit is configured to sense a second non-volatile storage element on the NAND string after the read pass voltage on the control gates of the non-volatile storage elements of the NAND string is discharged to a steady state voltage.

In one embodiment, a method of operating non-volatile storage comprises: sensing a first non-volatile storage element on a selected NAND string, comprising applying a read pass voltage to control gates of unselected non-volatile storage elements of the selected NAND string. The NAND string has a first select gate at a first end and a second select gate at a second end. The control gates include a first cluster of control gates, one or more clusters of control gates between the first cluster and the first select gate, and one or more clusters of control gates between the first cluster and the second select gate. The method further comprises applying a read pass voltage to the control gate of the first non-volatile storage element after the first non-volatile storage element is sensed; beginning to discharge the read pass voltage from the control gates of the first cluster prior to beginning to discharge the read pass voltage from the control gates in any of the other clusters and while the first select gate and the second select gate are in a conductive state; and sensing a second non-volatile storage element on the selected NAND string after discharging the read pass voltage on the control gates to a steady state voltage.

In one embodiment, a three-dimensional (3D) non-volatile storage device comprises: a plurality of conducting layers that alternate with a plurality of insulating layers in a stack; a plurality of NAND strings of non-volatile storage elements that extend through the stack of alternating conducting layers and insulating layers, and a control circuit in communication with the word lines and the plurality of NAND strings. The plurality of NAND strings each have a first select gate at a first end and a second select gate at a second end. A portion of each of the conducting layers serves as a word line for a cluster of the plurality of NAND strings. The word lines associated with the plurality of NAND strings include a first cluster of contiguous word lines, one or more clusters of contiguous word lines between the first cluster and the first select gate, and one or more clusters of contiguous word lines between the first cluster and the second select gate. The control circuit senses a first non-volatile storage element on a selected NAND string of the plurality of NAND strings while the control circuit applies a read pass voltage to unselected word lines associated with unselected non-volatile storage elements of the selected NAND string. The control circuit applies a read pass voltage to a selected word line associated with the first non-volatile storage element after the first non-volatile storage element is sensed. The control circuit begins to discharge the read pass voltage from the word lines of the first cluster prior to beginning to discharge the read pass voltage from the word lines in any other of the clusters and while the first select gate and the second select gate are in a conductive state. The control circuit senses a second non-volatile storage element on the selected NAND string after the read pass voltage on the word lines is discharged to a steady state voltage.

In one embodiment, a three-dimensional (3D) non-volatile storage device comprises a plurality of word line layers, as well as a plurality of NAND strings of non-volatile storage elements that extend through the word line layers. The word line layers serve as control gates for the non-volatile storage elements. The plurality of NAND strings each have a first select gate at a first end of the respective NAND string and a second select gate at a second end of the respective NAND string. The control gates include a first cluster of control gates, one or more clusters of control gates between the first cluster and the first select gate, and one or more clusters of control gates between the first cluster and the second select gate. The 3D non-volatile storage device further comprises sensing means for sensing a first non-volatile storage element on a selected NAND string of the plurality of NAND strings. The 3D non-volatile storage device further comprises voltage applying means for applying a read pass voltage to the control gates of unselected non-volatile storage elements of the selected NAND string when the sensing means senses a non-volatile storage element. The voltage applying means is further for applying a read pass voltage to the control gate of the first non-volatile storage element after the first non-volatile storage element is sensed. The 3D non-volatile storage device further comprises voltage discharge means for beginning to discharge the read pass voltage from the control gates of the first cluster prior to beginning to discharge the read pass voltage from the control gates in any other of the clusters and while the first select gate and the second select gate are in a conductive state. The sensing means is further for sensing a second non-volatile storage element on the selected NAND string after the read pass voltage on the control gates is discharged to a steady state voltage.

In one embodiment, the sensing means for sensing a first non-volatile storage element on a selected NAND string of the plurality of NAND strings comprises one or more of: read write circuits 128, sense block, state machine 112, power control 116, controller 122. The sensing means for sensing a first non-volatile storage element on a selected NAND string of the plurality of NAND strings may be implemented using other hardware and/or software.

In one embodiment, voltage applying means for applying a read pass voltage to the control gates of unselected non-volatile storage elements of the selected NAND string when the sensing means senses a non-volatile storage element comprises one or more of: read write circuits 128, state machine 112, power control 116, controller 122. The voltage applying means for applying a read pass voltage to the control gates of unselected non-volatile storage elements of the selected NAND string when the sensing means senses a non-volatile storage element may be implemented using other hardware and/or software.

In one embodiment, voltage discharge means for beginning to discharge the read pass voltage from the control gates of the first cluster prior to beginning to discharge the read pass voltage from the control gates in any other of the clusters and while the first select gate and the second select gate are in a conductive state comprises one or more of: read write circuits 128, state machine 112, power control 116, controller 122. The voltage discharge means for beginning to discharge the read pass voltage from the control gates of the first cluster prior to beginning to discharge the read pass voltage from the control gates in any other of the clusters and while the first select gate and the second select gate are in a conductive state may be implemented using other hardware and/or software.

In one embodiment, means for keeping all non-volatile storage elements between the first cluster of control gates and the first select gate of the selected NAND string turned on until the control gate voltage in the first cluster has discharged to the steady state voltage comprises one or more of: read write circuits 128, state machine 112, power control 116, controller 122. The means for keeping all non-volatile storage elements between the first cluster of control gates and the first select gate of the selected NAND string turned on until the control gate voltage in the first cluster has discharged to the steady state voltage may be implemented using other hardware and/or software.

In one embodiment, means for keeping all non-volatile storage elements between the first cluster of control gates and the second select gate of the selected NAND string turned on until the control gate voltage in the first cluster has discharged to the steady state voltage comprises one or more of: read write circuits 128, state machine 112, power control 116, controller 122. The means for keeping all non-volatile storage elements between the first cluster of control gates and the second select gate of the selected NAND string turned on until the control gate voltage in the first cluster has discharged to the steady state voltage may be implemented using other hardware and/or software.

In one embodiment, a non-volatile storage device comprises a string of non-volatile storage elements, and a control circuit in communication with the string. The control circuit is configured to sense a first non-volatile storage element on the string of non-volatile storage elements. Sensing the first non-volatile storage element results in a threshold voltage of a second non-volatile storage element on the string changing from a first threshold voltage to a second threshold voltage. The control circuit is configured to perform a weak erase of the second non-volatile storage element on the string to change the threshold voltage of the second non-volatile storage element back to substantially the first threshold voltage. The control circuit is configured to sense the second non-volatile storage element after performing the weak erase of the second non-volatile storage element at a time when the second non-volatile storage element still has substantially the first threshold voltage.

In one embodiment, a method of operating non-volatile storage comprises applying a boosting voltage to control gates of non-selected non-volatile storage elements on a NAND string while applying a weak erase voltage to a selected control gate of a selected non-volatile storage element of the NAND string and while cutting off a channel of the NAND string from a bit line and from a source line. The method also comprises applying a sense voltage to the selected control gate after applying the weak erase voltage to the selected control gate, connecting the NAND string channel to the bit line and to the source line after applying the boosting voltage and the weak erase voltage, and sensing the bit line while the sense voltage is applied to the selected control gate and while the NAND string channel is connected to the to the bit line and to the source line.

In one embodiment, a three-dimensional (3D) non-volatile storage device comprises alternating layers of conducting material and insulating material, a plurality of NAND strings of non-volatile storage elements that extend through the alternating layers of conducting material and insulating material, a plurality of bit lines, a common source line, and a control circuit in communication with the plurality of bit lines, the common source line and the control gates of the non-volatile storage elements. The conducting material serves as control gates for the non-volatile storage elements. The plurality of NAND strings each have a first end and a second end. Each of the first ends of the plurality of NAND strings is associated with a bit line of the plurality of bit lines. The common source line is associated with the second ends of the plurality of NAND strings. The control circuit applies a boosting voltage to control gates of non-selected non-volatile storage elements on a selected NAND string of the plurality of NAND strings while the control circuit applies a weak erase voltage to the control gate of a selected non-volatile storage element of the selected NAND string and while the control circuit cuts off a channel of the selected NAND string from its associated bit line and from the common source line. The control circuit removes the weak erase voltage from the control gate of the selected non-volatile storage element and applies a sense voltage to the control gate of the selected non-volatile storage. The control circuit connects the selected NAND string channel to the bit line and to the common source line after the boosting voltage and the weak erase voltage are applied. The control circuit senses the bit line while the sense voltage is applied to the control gate of the selected non-volatile storage element and while the channel of the selected NAND string is connected to the bit line and to the common source line.

In one embodiment, a three-dimensional (3D) non-volatile storage device comprises a substrate, alternating layers of conducting material and insulating material above the substrate, a plurality of NAND strings of non-volatile storage elements that extend through the alternating layers of conducting material and insulating material, a plurality of bit lines, and a common source line. The conducting material serves as control gates for the non-volatile storage elements. The plurality of NAND strings each having a first end and a second end. Each of the first ends of the plurality of NAND strings is associated with a bit line of the plurality of bit lines. The common source line is associated with the second ends of the plurality of NAND strings. The 3D non-volatile storage device further comprises sensing means for sensing a first non-volatile storage element on a NAND string of non-volatile storage elements. The sensing results in trapped electrons in a second non-volatile storage element on the NAND string. The 3D non-volatile storage device further comprises weak erase means for performing a weak erase of the second non-volatile storage element on the NAND string to remove the trapped electrons. The sensing means is further for sensing the second non-volatile storage element after the weak erase means performs the weak erase.

In one embodiment, sensing means for sensing a first non-volatile storage element on a NAND string of non-volatile storage elements comprises one or more of: read write circuits 128, state machine 112, power control 116, controller 122. The sensing means for sensing a first non-volatile storage element on a NAND string of non-volatile storage elements may be implemented using other hardware and/or software.

In one embodiment, weak erase means for performing a weak erase of the second non-volatile storage element on the NAND string to remove the trapped electrons comprises one or more of: read write circuits 128, state machine 112, power control 116, controller 122. The weak erase means for performing a weak erase of the second non-volatile storage element on the NAND string to remove the trapped electrons may be implemented using other hardware and/or software.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:
1. A non-volatile storage device comprising:
a string of non-volatile storage elements; and
a control circuit in communication with the string, the control circuit configured to:
sense a first non-volatile storage element on the string of non-volatile storage elements, sensing the first non-volatile storage element results in a threshold voltage of a second non-volatile storage element on the string changing from a first threshold voltage to a second threshold voltage;
perform a weak erase of the second non-volatile storage element on the string to change the threshold voltage of the second non-volatile storage element back to substantially the first threshold voltage; and
sense the second non-volatile storage element after performing the weak erase of the second non-volatile storage element at a time when the second non-volatile storage element still has substantially the first threshold voltage.

2. The non-volatile storage device of claim 1, wherein the control circuit is configured to perform the weak erase of the second non-volatile storage element as a part of a sensing operation of the second non-volatile storage element.

3. The non-volatile storage device of claim 2, further comprising a bit line associated with the string of non-volatile storage elements and a source line associated with the string of non-volatile storage elements, wherein each of the non-volatile storage elements of the string has a control gate, wherein the string of non-volatile storage elements comprises a string channel, wherein to perform the weak erase the control circuit is configured to:

boost the string channel to a boosted channel potential while the control circuit applies a voltage below the boosted channel potential to the control gate of the second non-volatile storage element.

4. The non-volatile storage device of claim 3, wherein to boost the string channel the control circuit is configured to:
cut off the string channel from the bit line and from the source line; and
apply a boosting voltage to the control gates of unselected non-volatile storage elements of the string.

5. The non-volatile storage device of claim 4, wherein the boosting voltage is a read pass voltage.

6. The non-volatile storage device of claim 1, wherein the first non-volatile storage element and the second non-volatile storage element are the same non-volatile storage element.

7. The non-volatile storage device of claim 1, wherein the string of non-volatile storage elements has a first end and a second end, wherein each of the non-volatile storage elements has a control gate, wherein to perform the weak erase of the second non-volatile storage element the control circuit is configured to:
apply a first voltage to the first end of the string while the control circuit applies a second voltage to the control gate of the second non-volatile storage element, the second voltage is lower than the first voltage.

8. The non-volatile storage device of claim 1, wherein the string of non-volatile storage elements is formed on a substrate, wherein each of the non-volatile storage elements has a control gate, wherein to perform the weak erase of the second non-volatile storage element the control circuit is configured to:
apply a first voltage to the substrate while the control circuit applies a second voltage to the control gate of the second non-volatile storage element, the second voltage is lower than the first voltage.

9. The non-volatile storage device of claim 8, further comprising alternating layers of conducting material and insulating material above the substrate, wherein the string of non-volatile storage elements extends through the layers of the conducting material and the insulating material, the conducting material serving as control gates of the non-volatile storage elements of the string.

10. The non-volatile storage device of claim 1, wherein the control circuit is configured to adjust a magnitude of the weak erase of the second non-volatile storage element based on temperature.

11. A method of operating non-volatile storage, the method comprising:
applying a boosting voltage to control gates of non-selected non-volatile storage elements on a NAND string while applying a weak erase voltage to a selected control gate of a selected non-volatile storage element of the NAND string and while cutting off a channel of the NAND string from a bit line and from a source line;
applying a sense voltage to the selected control gate after applying the weak erase voltage to the selected control gate;
connecting the NAND string channel to the bit line and to the source line after applying the boosting voltage and the weak erase voltage; and
sensing the bit line while the sense voltage is applied to the selected control gate and while the NAND string channel is connected to the to the bit line and to the source line.

12. The method of claim 11, further comprising:
sensing a first non-volatile storage element on the NAND string prior to cutting off the NAND string channel from the bit line and from the source line, wherein the selected non-volatile storage element is a second non-volatile storage element on the NAND string, sensing the first non-volatile storage element changes a threshold voltage of the second non-volatile storage element from a first threshold voltage to a second threshold voltage;
wherein applying the boosting voltage to the control gates of non-selected non-volatile storage elements on the NAND string channel while applying the weak erase voltage to the control gate of the selected non-volatile storage element of the NAND string changes the threshold voltage of the second non-volatile storage element back to substantially the first threshold voltage.

13. The method of claim 12, wherein the first non-volatile storage element is the selected non-volatile storage element.

14. The method of claim 12, wherein the first non-volatile storage element is not the selected non-volatile storage element.

15. The method of claim 11, further comprising:
adjusting magnitude or duration of one or both of the boosting voltage or the weak erase voltage based on temperature.

16. A three-dimensional (3D) non-volatile storage device, comprising:
alternating layers of conducting material and insulating material;
a plurality of NAND strings of non-volatile storage elements that extend through the alternating layers of conducting material and insulating material, the conducting material serves as control gates for the non-volatile storage elements, the plurality of NAND strings each having a first end and a second end;
a plurality of bit lines, each of the first ends of the plurality of NAND strings is associated with a bit line of the plurality of bit lines;
a common source line associated with the second ends of the plurality of NAND strings; and
a control circuit in communication with the plurality of bit lines, the common source line and the control gates of the non-volatile storage elements, the control circuit:
applies a boosting voltage to control gates of non-selected non-volatile storage elements on a selected NAND string of the plurality of NAND strings while the control circuit applies a weak erase voltage to the control gate of a selected non-volatile storage element of the selected NAND string and while the control circuit cuts off a channel of the selected NAND string from its associated bit line and from the common source line;
removes the weak erase voltage from the control gate of the selected non-volatile storage element and applies a sense voltage to the control gate of the selected non-volatile storage;
connects the selected NAND string channel to the bit line and to the common source line after the boosting voltage and the weak erase voltage are applied; and
senses the bit line while the sense voltage is applied to the control gate of the selected non-volatile storage element and while the channel of the selected NAND string is connected to the bit line and to the common source line.

17. The 3D non-volatile storage device of claim 16, wherein the control circuit further:

senses a first non-volatile storage element on the selected NAND string prior to cutting off the channel of the selected NAND string from the bit line and from the common source line, wherein the selected non-volatile storage element is a second non-volatile storage element on the NAND string, sensing the first non-volatile storage element changes a threshold voltage of the second non-volatile storage element from a first threshold voltage to a second threshold voltage;

wherein the control circuit applies the boosting voltage to the control gates of non-selected non-volatile storage elements on the selected NAND string channel while the control circuit applies the weak erase voltage to the control gate of the selected non-volatile storage element of the selected NAND string to change the threshold voltage of the second non-volatile storage element back to substantially the first threshold voltage.

18. The 3D non-volatile storage device of claim 16, wherein the control circuit further:

senses a first non-volatile storage element on the selected NAND string prior to cutting off the channel of the selected NAND string from the bit line and from the common source line, wherein the selected non-volatile storage element is a second non-volatile storage element on the selected NAND string, sensing the first non-volatile storage element results in residual electrons in the selected non-volatile storage element, wherein the control circuit applies the boosting voltage to the control gates of non-selected non-volatile storage elements on the selected NAND string channel while the control circuit applies the weak erase voltage to the control gate of the selected non-volatile storage element of the selected NAND string to remove the residual electrons from the selected non-volatile storage element.

19. A three-dimensional (3D) non-volatile storage device, comprising:

a substrate;

alternating layers of conducting material and insulating material above the substrate;

a plurality of NAND strings of non-volatile storage elements that extend through the alternating layers of conducting material and insulating material, the conducting material serves as control gates for the non-volatile storage elements, the plurality of NAND strings each having a first end and a second end;

a plurality of bit lines, each of the first ends of the plurality of NAND strings is associated with a bit line of the plurality of bit lines;

a common source line associated with the second ends of the plurality of NAND strings; and sensing means for sensing a first non-volatile storage element on a NAND string of non-volatile storage elements, the sensing results in trapped electrons in a second non-volatile storage element on the NAND string; and weak erase means for performing a weak erase of the second non-volatile storage element on the NAND string to remove the trapped electrons;

wherein the sensing means is further for sensing the second non-volatile storage element after the weak erase means performs the weak erase.

20. The three-dimensional (3D) non-volatile storage device of claim 19, wherein the weak erase means comprises:

NAND string channel cut off means for cutting off the NAND string channel from a bit line and from a source line after the first non-volatile storage element is sensed;

boosting means for boosting the NAND string channel to a boosted channel potential while a control gate of the second non-volatile storage element is at a voltage below the boosted channel potential and while the NAND string channel is cut off; and NAND string channel connecting means for connecting the NAND string channel to the bit line and to the source line to remove the boosted channel potential from the NAND string channel.

* * * * *